(12) United States Patent
Barakchi Fard et al.

(10) Patent No.: US 10,078,321 B2
(45) Date of Patent: Sep. 18, 2018

(54) DEVICE, SYSTEM AND METHODS FOR AUTOMATIC DEVELOPMENT AND OPTIMIZATION OF POSITIONING PATHS FOR MULTI-AXIS NUMERICALLY CONTROLLED MACHINING

(71) Applicant: ICAM Research Corporation, Sainte-Anne-de-Bellevue (CA)

(72) Inventors: Mohammad Javad Barakchi Fard, Findlay, OH (US); Adam Nowak, Pointe Claire (CA); Brian R. Francis, Pointe Claire (CA)

(73) Assignee: ICAM Research Corporation, Sainte-Ann-de-Bellevue, Quebec (CA)

( * ) Notice: Subject to any disclaimer, the term of this patent is extended or adjusted under 35 U.S.C. 154(b) by 0 days.

(21) Appl. No.: 15/288,480

(22) Filed: Oct. 7, 2016

(65) Prior Publication Data
US 2017/0090454 A1 Mar. 30, 2017

Related U.S. Application Data

(63) Continuation of application No. 13/957,949, filed on Aug. 2, 2013, now Pat. No. 9,465,380.

(51) Int. Cl.
*G05B 19/00* (2006.01)
*G05B 15/02* (2006.01)
(Continued)

(52) U.S. Cl.
CPC .............. *G05B 19/29* (2013.01); *G05B 19/19* (2013.01); *G05B 19/4069* (2013.01);
(Continued)

(58) Field of Classification Search
CPC ............ G05B 19/4103; G05B 19/4097; G05B 2219/50109; G05B 2219/49392;
(Continued)

(56) References Cited

U.S. PATENT DOCUMENTS 4,907,164 A 3/1990 Guyder
4,951,217 A * 8/1990 Clack ..................... G05B 19/41
700/178
(Continued)

FOREIGN PATENT DOCUMENTS

EP 1209544 A1 5/2002
JP 2014219933 A 11/2014
WO WO2012077910 * 6/2012 ........... B23Q 15/013

OTHER PUBLICATIONS

"Determination of Optimal Path Under Approach and Exit Constraints," W. A. Khan et al; European Journal of Operational Research 117 (1999) 310-325.
(Continued)

*Primary Examiner* — Ronald D Hartman, Jr.
(74) *Attorney, Agent, or Firm* — Harris Beach PLLC; Neal L. Slifkin

(57) ABSTRACT

Optimized positioning paths for multi-axis CNC machining can be generated based on the machine tool kinematics, machine axes travel limits, machine axis velocity and acceleration limits, and machine positioning methodologies. Machine axes travel limits and machine positioning methodologies are incorporated in order to ensure that the developed positioning paths do not violate machine axes travel limitations. Multi-axis positioning paths are developed to avoid collisions with dynamically changing in-process stock and other surroundings, including fixtures and both moving and non-moving components of the machine. Positioning tool path customizations give the user the flexibility to apply safety based constraints to the automatically generated tool paths. The disclosed automatic positioning path planning and optimization methods are used to develop a process for part manufacturing using CNC machining in order to reduce the manufacturing cycle time.

19 Claims, 18 Drawing Sheets

(51) Int. Cl.
G05B 19/29 (2006.01)
G05B 19/19 (2006.01)
G06F 17/50 (2006.01)
G05B 19/4069 (2006.01)
G05B 19/401 (2006.01)
G05B 19/4097 (2006.01)
G05B 19/4103 (2006.01)

(52) U.S. Cl.
CPC .......... *G06F 17/5009* (2013.01); *G05B 15/02* (2013.01); *G05B 19/401* (2013.01); *G05B 19/4097* (2013.01); *G05B 19/4103* (2013.01); *G05B 2219/35303* (2013.01); *G05B 2219/35346* (2013.01); *G05B 2219/49392* (2013.01); *G05B 2219/50047* (2013.01); *G05B 2219/50109* (2013.01)

(58) Field of Classification Search
CPC ................ G05B 19/404; G05B 19/401; G05B 2219/2642; G05B 15/02; G05B 13/02
USPC .......... 700/186, 190, 192–193; 318/570–571
See application file for complete search history.

(56) References Cited

U.S. PATENT DOCUMENTS

| | | | | |
|---|---|---|---|---|
| 5,005,135 A | * | 4/1991 | Morser | G05B 19/373 318/571 |
| 5,363,308 A | * | 11/1994 | Guyder | G05B 19/4099 318/570 |
| 6,490,500 B1 | * | 12/2002 | McCulloch | G05B 19/4062 318/565 |
| 6,606,528 B1 | * | 8/2003 | Hagmeier | G05B 19/4097 345/420 |
| 6,832,876 B2 | | 12/2004 | Hobbs | |
| 7,451,013 B2 | * | 11/2008 | Coleman | G05B 19/40937 700/159 |
| 8,694,149 B2 | * | 4/2014 | Diehl | G05B 19/40937 409/132 |
| 2010/0292822 A1 | | 11/2010 | Hahn | |
| 2011/0087364 A1 | | 4/2011 | Gray | |
| 2012/0296462 A1 | | 11/2012 | Otsuki et al. | |
| 2014/0336811 A1 | | 11/2014 | Yuki | |
| 2015/0205294 A1 | * | 7/2015 | Song | G05B 19/4097 700/182 |

OTHER PUBLICATIONS

"Application of Heuristic and Hybrid-GASA Algorithms to Tool-Path Optimization Problem for Minimizing Airtime During Machining," Cuneyt Oysu, Zafer Bingul, Engineering Applications of Artificial Intelligence 22 (2009) 389-396.

"Tool-Path Optimization for Minimizing Airtime during Machining," Kenneth Castelino, Roshan D'Souza and Paul K. Wright, Mechanical Engineering Dept., University of California at Berkeley, Berkeley, California 94720, USA.

"Models for Tool-Path Plan Optimization in Patch-by-Patch Machining," D. Veeramani and Y.-S, Gau, Int J. Prod. Res., 1998, vol. 36, No. 6, 1633-1651.

"Time Minimization of CNC Part Programs in a Vertical Machining Center in Terms of Tool Path and Cutting Parameter Criteria," Ahmet Murat Pinar, Abdulkadir Gullu, Turkish J. Eng. Env. Sci. 29 (2005), 75-88.

"SmartPATH . . . Automatic Toolpath Optimization" Brochure; ICAM Technologies Corporation; www.icam.com; 2 pages.

"Notification of Transmittal of International Search Report and the Written Opinion of the International Searching Authority, or the Declaration;" PCT/CA2014/000452, dated Aug. 14, 2014, 8 pages.

Extended European Search Report for EP 14 83 2853 dated Mar. 7, 2017.

English Translation of "Notice of Reasons for Rejection" for Japanese Patent Application No. 2016-530283 Office Action, dated April 16, 2018. 3 Pages.

* cited by examiner

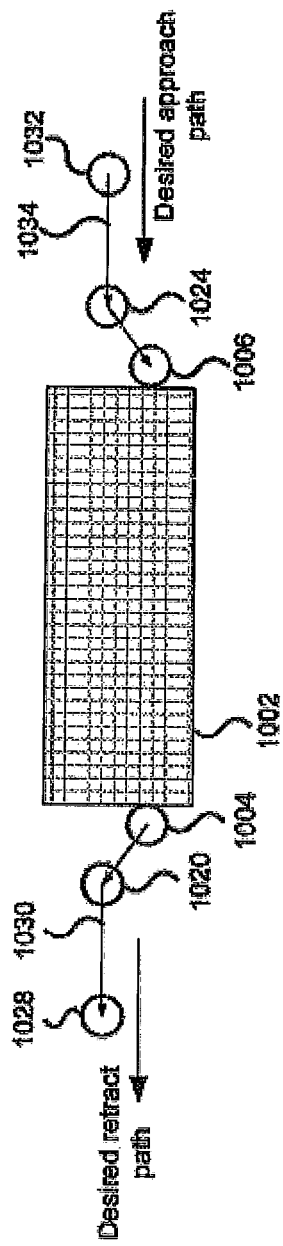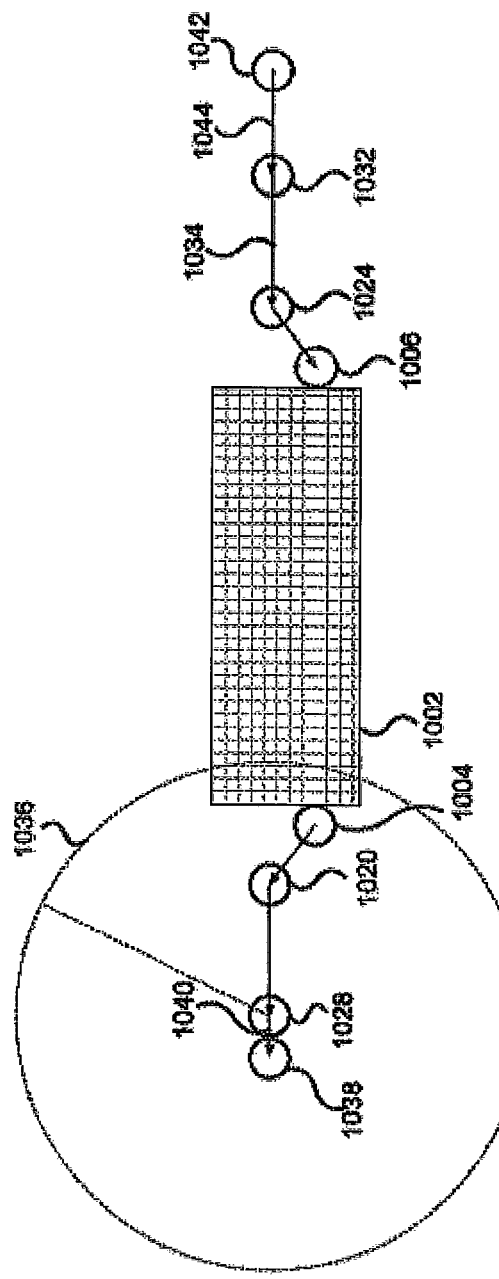

DEVICE, SYSTEM AND METHODS FOR AUTOMATIC DEVELOPMENT AND OPTIMIZATION OF POSITIONING PATHS FOR MULTI-AXIS NUMERICALLY CONTROLLED MACHINING

CROSS-REFERENCE TO RELATED APPLICATION

The present application is a continuation of a pending U.S. application Ser. No. 13/957,949, filed Aug. 2, 2013, the disclosure of which is hereby incorporated by reference.

TECHNICAL FIELD

The current description relates to device, system and methods of generating a control program for a multi-axis numerically controlled (NC) machine that automatically determines and minimizes or reduces positioning paths of a tool while avoiding tool or workpiece collision.

BACKGROUND

Numerical Control (NC) is a method of automatically operating a machine tool based on code letters, discrete numerical values, and special characters. A Computer Numerical Control (CNC) machine tool is an NC machine tool that is controlled by computers. CNC machine tools are used to machine a workpiece to a finished shape by providing a relative motion between the workpiece and the cutting tool. This relative motion could be provided differently for various operations either by holding the workpiece stationary and moving the cutting tool, as in drilling, or by holding the cutting tool stationary and rotating the workpiece, as in turning.

A CNC machine tool is equipped with different axes of motion in order to provide the required relative motion between the cutting tool and the workpiece. Each of these axes has a driving device that might be a dc motor, a hydraulic actuator, or a stepper motor.

FIG. 1 illustrates a multi-axis CNC machine 100. The machine includes a cutting or machining tool 102 that can be moved relative to a workpiece 118 along a plurality of different axes. As depicted in FIG. 1, the machining tool can be moved along three linear and orthogonal axes namely the X axis 104, the Y axis 106 and the Z axis 108. Although depicted as being orthogonal, it is possible that the machine tool can be moved along a plurality of non-orthogonal axes. Additionally the machining tool 102 may rotate about one or more axes. The rotation is depicted as being about the A axis 110, the B axis 112 and the C axis 114. The A, B and C axes are depicted as being parallel with the X, Y and Z axes however, the axes do not need to be parallel. The workpiece 118 is positioned on a machine table 116 in a known location allowing translation of the workpiece coordinates Xw 120, Yw 122, Zw 124 to the machine coordinates to allow machining of the workpiece. Although the movement of the machining tool 102 is depicted as occurring at the tool 102 itself, it is noted that the motion is relative to the workpiece, and as such, motion of the workpiece or tool, or a combination thereof can produce the same results. For example, the tool 102 may rotate about the A, B and C axis and travel along the Z-axis while the table 116 moves the workpiece in the X and Y axis. Multi-axis machines generally allow movement about the X, Y and Z axis and one or more, and typically 2, of the rotary axes A, B, and C. The movement between the tool and the workpiece may be provided by movement of the tool head and/or the workpiece or a platform the workpiece is affixed to.

CAD/CAM software can be used to specify the movement of a tool relative to the workpiece required to produce a part from a workpiece. The CAD/CAM software produces a plurality of tool paths that include cutting paths, which are paths in which the tool is in contact with the workpiece in order to remove material to form the part, and positioning paths, which position the tool to or from cutting paths without contacting objects in the machining scene. The objects of the machining scene may include the workpiece itself, fixtures securing the workpiece as well as portions of the machine or any other objects that the tool may collide with. Typically positioning paths are traversed by rapid motions that use the maximum velocity of the machine axes or a high velocity.

FIG. 2A depicts an initial configuration of a cutting tool relative to a workpiece. FIG. 2B depicts cutting and positioning paths for producing a part from the workpiece. A tool 204 is at an initial position relative to the workpiece 202 as depicted in FIG. 2A. As depicted in FIG. 2B, the tool 204 moves along a positioning path A 206 to a start position 208 of a cutting path. The cutting path B 210 moves the tool to the end location 212 of the cutting path B which causes the removal of material 240. The tool is then repositioned to the start position 230 of the next cutting path by positioning path C 218. The positioning path C comprises 3 movements 220, 224, 228. First, the tool is retracted to a position 222 on or above a clearance plane 216. Next the tool is moved to a position 226 above the start position 230 of the next cutting path. Finally the tool is plunged 228 to the start position 230. The tool is moved along the cutting path D 232 from the start position 230 to the end position 234 and then moved along the positioning path E 236. Positioning path again retracts the tool to the position 238 above the clearance plane 216.

FIG. 3 depicts the process of designing and producing a part on a CNC machine. In order to machine a part from a workpiece, the part is designed in a computer aided design (CAD) application 302 and neutral machining instructions can be developed in a computer aided manufacturing (CAM) application 302. The neutral machining instructions specify movement of the tool or tools as a plurality of cutter locations. The CAM application generates tool paths that specify the movement of a tool relative to the workpiece. The tool paths include cutting paths, in which the tool is moved relative to the workpiece and is in contact with the workpiece, and non-cutting or positioning paths, in which the tool is positioned from one location to another without contacting the workpiece or other components. As depicted the CAD/CAM application 302 may output the tool paths as a cutter location data (CL Data) 304. The CL Data 304 specifies the tool location, and other machining characteristics such as feed rate, positioning speed, cutting speed, etc, in a manner that can be subsequently translated into machine specific instructions. The CL Data 304 comprises one or more cutting paths 306, 310, 314 each of which comprises a start configuration of the tool and an end configuration of the tool. The tool is moved between cutting paths by respective positioning paths 308, 312. Positioning paths may be developed in the CAD/CAM application 302 by providing a user-specified clearance plane that is defined relative to the workpiece coordinates and geometry. A similar approach is for the user to define one or more safety zones. In either case, the CAM application retracts the tool to the safe zone, or to the clearance plane and then moves within the clearance plane or safety zone to approach the next cutting location, and finally moves to the start of the next cutting location. Additionally or alternatively, the CAD/CAM application may allow the user to specify the positioning paths manually by defining movements along different directions. Regardless of how the positioning paths are generated, they can require considerable user interaction to produce safe positioning paths for a particular machine.

In order to machine a part according to the specified CL Data, the CL Data must be transformed into machine-dependent code for the particular machine being used to machine the part. This translation is performed by an NC post-processor 316. The post-processor 316 receives controller settings 318, and a machine selection 320 specifying a particular machine that will be used to machine the part. The post-processor transforms the CL Data 304 into a machine specific NC program 324. The post-processor 316 generates the NC program using information about the kinematics of the selected machine 322, that is information about how the selected machine provides the relative movement between the tool and the workpiece. As depicted the NC program 324 may be executed by a simulation of the CNC machine 326 in order to verify that the positioning paths and cutting paths are valid, that is there are no collisions between objects in the machining scene and machine travel limits are respected. The simulation of the CNC machine 326 may also verify the syntax of the NC program to ensure it uses proper syntax. If the NC program comprises valid positioning paths and cutting paths 330, the NC program can be executed on the CNC machine 332 to produce the part.

The NC program 324 is typically first run on a CNC machine simulator 326 to ensure that the NC program 324 does not cause collisions, or violate machine travel limits. Non-cutting positioning paths generated by CAM applications for multi-axis machining can be unsafe and inefficient. This is mainly because CAM applications ignore the particular machine characteristics of the CNC machine that will be used to produce the part. The machine characteristics may include, for example, machine tool kinematics, axis travel velocities, axis acceleration, travel limitations, positioning methodologies, and workpiece setup in the generation of positioning tool paths. Accordingly, invalid positioning paths or cutting paths 328 must be adjusted in the CAM application using trial and error. Once the user has adjusted the positioning paths, the NC program can be generated and tested again. This process of trial and error must be repeated until successful positioning paths are defined in the CAM application. The trial and error process for generating positioning paths for a particular CNC machine can require considerable user interaction.

The trial and error by a user required to specify safe positioning paths for a specific machine is undesirable. Further, once an NC program is generated with safe positioning paths, it is machine specific and the time consuming trial and error process needs to be carried out again if the part is to be machined on a different machine having different machine kinematics. Further still, the positioning paths developed by the trial and error process may not be the optimal positioning paths resulting in longer machining time.

An alternative to developing positioning paths is desirable. In this regard, it may be beneficial to automatically develop positioning paths without substantial user interaction as an alternative to the current techniques for developing positioning paths.

SUMMARY

In accordance with the present disclosure there is provided a method for generating positioning path data for a computer numerically controlled (CNC) machine, the method comprising determining a start configuration and a goal configuration of a tool in a machine configuration space; identifying respective regions surrounding one or more relevant features of a machining scene in the machine configuration space for sampling of possible configurations; determining a plurality of possible configurations from each of the identified one or more regions in the machine configuration space; determining a positioning path from, the plurality of possible configurations that connects the start configuration to the goal configuration; determining if the determined positioning path is valid using a simulation of the CNC machine; and generating positioning path data for moving the tool of the CNC machine along the determined positioning path if the positioning path is determined to be valid.

In a further embodiment, the method may further comprise determining an initial positioning path that connects the start configuration to the goal configuration without violating machining constraints; and wherein the positioning path determined from the plurality of possible configurations is determined to have a lower associated time-cost than a time-cost of the initial positioning path.

In a further embodiment, determining the initial positioning path may comprise: determining a first intermediary configuration by translating the start configuration a first distance in a first preferred direction; determining a second intermediary configuration by translating the goal configuration a second distance in a second preferred direction; connecting the first intermediary configuration to the second intermediary configuration; and optimizing a travel time of the positioning path by reducing the first distance and second distance without causing the initial positioning path to violate the machining constraints.

In a further embodiment, the first distance and the second distance that are reduced are the same distances.

In a further embodiment, the method may further comprise: determining if the initial positioning path violates the machining constraints; and if the initial positioning path violates the machining constraints: translating the start configurations and the goal configurations in respective other preferred directions; and connecting the first intermediary configuration to the second intermediary configuration.

In a further embodiment, the first preferred direction, the second preferred direction, and the other preferred directions are selected from one or more of: a direction based on a tool axis orientation of the start configuration; a direction based on a tool axis orientation of the goal configuration; and a direction based on an axis of control of the CNC machine.

In a further embodiment, a time-cost associated with a path is determined by simulating movement of the CNC machine.

In a further embodiment, simulating movement of the CNC machine comprises simulating acceleration limits on machine axes when determining the time-cost.

In a further embodiment, a time-cost associated with a path is determined using a length of the path and known travel velocities along machine axes.

In a further embodiment, determining if a path violates machining constraints comprises using a simulator of the CNC machine to determine if the path is valid or not.

In a further embodiment, determining the start configuration and the goal configuration in the machine configuration space comprises: receiving a start configuration and goal configuration in a workpiece space; and transforming the start and goal configurations in the workpiece space to the start and goal configurations in the machine configuration space.

In a further embodiment, determining the start configuration and the goal configuration in the machine configuration space comprises adjusting at least one of the start configuration and the goal configuration based on one or more user preferences.

In a further embodiment, adjusting at least one of the start configuration and the goal configuration comprises, for the respective configuration being adjusted: translating the respective configuration in order to move the tool of the CNC machine out of contact with the work piece; and adding the translation of the respective configuration to the positioning path data.

In a further embodiment, the translation of the respective configuration is determined by: sampling a plurality of sphere locations from a surface of a sphere centered around the respective configuration; and attempting to identify a sampled sphere location that does not cause the tool to be in contact with the workpiece when the tool is translated to the sampled sphere location; and determining that the path translating the tool to the sampled sphere location is valid.

In a further embodiment, the method may comprise: expanding a radius of the sphere and sampling additional sphere locations if a sample sphere location that does not cause the tool to be in contact with the workpiece is not identified, wherein sphere locations on a smaller radius sphere minimize the translation of the respective configurations; and attempting to identify the sphere location that does not cause the tool to be in contact with the workpiece from the additional sphere locations.

In a further embodiment, adjusting at least one of the start configuration and the goal configuration comprises at least one of: adjusting the start configuration based on a user specified retract path; adjusting the goal configuration based on a user specified approach path; determining that paths adjusting the start configuration and the goal configuration are valid; and adding movements of the adjustments to the start and goal configurations to the positioning path data.

In a further embodiment, adjusting at least one of the start configuration and the goal configuration comprises: adjusting the start configuration to a location that accommodates an expanded tool size expanded by a user specified minimum safety distance; adjusting the goal configuration to a location that accommodates the expanded tool size; determining that paths adjusting the start configuration and the goal configuration are valid; adding movements of the adjustments to the start and goal configurations to the positioning path data; and adjusting the simulation of the CNC machine to use an offset tool with an offset based on the user specified minimum safety distance when determining if the positioning path is valid.

In a further embodiment, adjusting each of the start configuration and the goal configuration to accommodate the expanded tool size comprises: sampling a plurality of sphere locations from a surface of a sphere centered around the respective configuration and having a radius at least equal to the user specified minimum safety distance; and attempting to identify a sampled sphere location that does not cause the expanded tool to be in contact with the workpiece when the expanded tool is translated to the sampled sphere location.

In a further embodiment, the method may further comprise expanding a radius of the sphere and sampling additional sphere locations if a sample sphere location that does not cause the expanded tool to be in contact with the workpiece is not identified, wherein sphere locations on a smaller radius sphere minimize the translation of the respective configurations; and attempting to identify the sphere location that does not cause the expanded tool to be in contact with the workpiece from the additional sphere locations.

In a further embodiment, the relevant features of the machining scene in the machine configuration space comprise one or more of: known configurations along a positioning path; and respective bounding boxes of one or more objects in the machining scene.

In a further embodiment, the method may further comprise: dividing control axes of the CNC machine into spans based on maximum and minimum travel values for the respective control axis and the start and goal configurations; determining if each of the spans has been sampled by the plurality of possible configurations from the identified regions; and collecting a plurality of additional possible configurations from outside of the identified regions to provide samples of possible configurations from each of the spans.

In a further embodiment, a minimum sampling resolution is defined for each of the control axes of the CNC machine, the minimum sampling resolution defining the minimum distance between samples of the respective control axis.

In a further embodiment, the method may further comprise removing possible configurations from the plurality of possible configurations if they are within an excluded region in the machine configuration space.

In a further embodiment, determining the positioning path comprises: treating the plurality of possible configurations, the start configuration and the goal configuration as a graph; and searching the graph for a path from the start configuration to the goal configuration.

In a further embodiment, the graph is searched using a heuristics based search technique which finds a lowest cost path that is less than an upper bound through the graph if such a path exists.

In a further embodiment, when the path through the graph exists, the path is used as the positioning path, and wherein determining if the positioning path is valid comprises: receiving an indication from the simulation of the CNC machine that the positioning path is valid or not, the indication comprising an indication of a configuration that caused the invalidity of the positioning path when the positioning path is invalid; determining a segment of the graph associated with the indicated configuration that caused the invalidity of the positioning path; and removing the determined segment from the graph.

In a further embodiment, the method may further comprise: determining if the search of the graph has exhausted all possible paths when the positioning path is not valid; and searching the graph again, when the search of the graph is not exhausted, for a path from the start configuration to the goal configuration.

In a further embodiment, the method may further comprise: collecting a further plurality of possible configurations from the machine configuration space when no path through the graph that has an associated cost less than the upper bound is found or when the search of the graph is exhausted; and treating the plurality of possible configurations, the start configuration, the goal configuration and the further plurality of possible configurations as the graph; and searching the graph for a path from the start configuration to the goal configuration.

In a further embodiment, searching the graph comprises using an A* search technique.

In a further embodiment, wherein the A* search uses: a path travel time provided by the simulation of the CNC machine as a cost of a current path from the start configuration to a current configuration node of the graph; and a travel time provided by the simulation of the CNC machine as a cost between the current configuration node to the goal configuration.

In a further embodiment, the simulation of the CNC machine incorporates machine characteristics into simulating machining on the CNC machine, the machine characteristics comprising one or more of: machine kinematics; velocity limits; acceleration limits; travel limitations for each machine axis; positioning methodologies; workpiece setup; location of machine components or fixtures; and location of holding devices.

In a further embodiment, the simulation of the CNC machine simulates dynamically changing workpieces.

In accordance with the present disclosure there is further provided a computing device for generating positioning path data for a computer numerically controlled (CNC) machine, the system comprising a processor for executing instructions; and a memory for storing instructions, which when executed by the processor configures the system to provide a method for generating positioning path data for a computer numerically controlled (CNC) machine, the method comprising determining a start configuration and a goal configuration of a tool in a machine configuration space; identifying respective regions surrounding one or more relevant features of a machining scene in the machine configuration space for sampling of possible configurations; determining a plurality of possible configurations from each of the identified one or more regions in the machine configuration space; determining a positioning path from the plurality of possible configurations that connects the start configuration to the goal configuration; determining if the determined positioning path is valid using a simulation of the CNC machine; and generating positioning path data for moving the tool of the CNC machine along the determined positioning path if the positioning path is determined to be valid.

In accordance with the present disclosure there is further provided a system for machining a part, the system comprising a computing device for generating positioning path data for a computer numerically controlled (CNC) machine, the system comprising a processor for executing instructions; and a memory for storing instructions, which when executed by the processor configures the system to provide a method for generating positioning path data for a computer numerically controlled (CNC) machine, the method comprising determining a start configuration and a goal configuration of a tool in a machine configuration space; identifying respective regions surrounding one or more relevant features of a machining scene in the machine configuration space for sampling of possible configurations; determining a plurality of possible configurations from each of the identified one or more regions in the machine configuration space; determining a positioning path from the plurality of possible configurations that connects the start configuration to the goal configuration; determining if the determined positioning path is valid using a simulation of the CNC machine; and generating positioning path data for moving the tool of the CNC machine along the determined positioning path if the positioning path is determined to be valid; and a Computer Numerically Controlled (CNC) machine for receiving the NC program and machining a part from a workpiece in accordance with the NC program.

BRIEF DESCRIPTION OF THE DRAWINGS

Further features and advantages of the present disclosure will become apparent from the following detailed description, taken in combination with the appended drawings, in which:

FIGS. 10A, 10B, 10C, 10D depict positioning path customization;

DETAILED DESCRIPTION

Computer Numerically Controlled (CNC) machines allow a part to be machined from a workpiece in accordance with specific instructions. A part can be designed in a 3D modeling application, often referred to as Computer Aided Design (CAD) software. Computer Aided Manufacturing software can take a 3D model and produce code or instructions for generating the part. The code generated by CAM software specifies the movement of a tool in relation to a workpiece, in the coordinates of the workpiece. In order to machine a part, the tool locations specified in the workpiece coordinates need to be converted into tool locations in machine coordinates. At its most basic, this may be viewed as a translation of the workpiece coordinates based on the physical position of the workpiece in the CNC machine. However, in multi-axis machines that allow rotational movement as well as linear movement, the conversion may be more complex since the kinematics of the CNC machine may result in non-linear movement of the tool, while the generation of the tool paths in the CAM software assumes linear movement between tool configurations.

Figure 1:
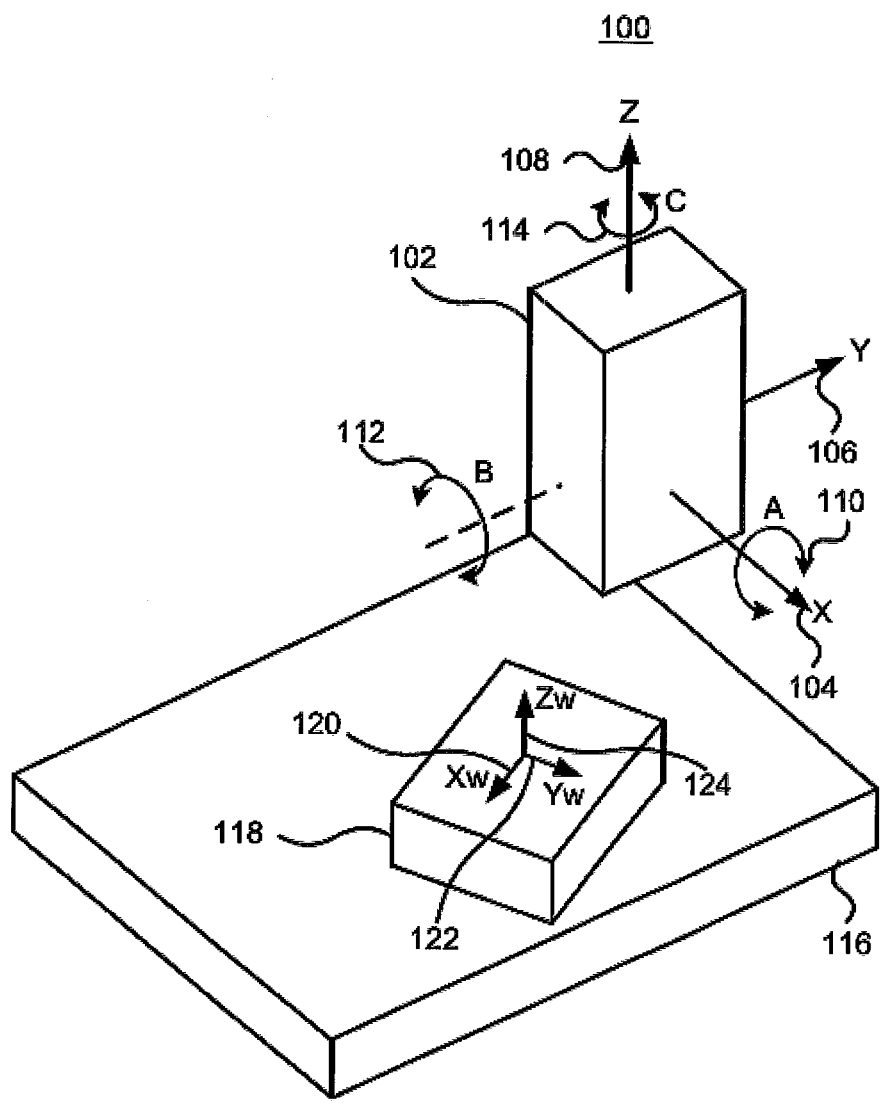
FIG. 1 illustrates a multi-axis CNC machine.
Figure 2A:
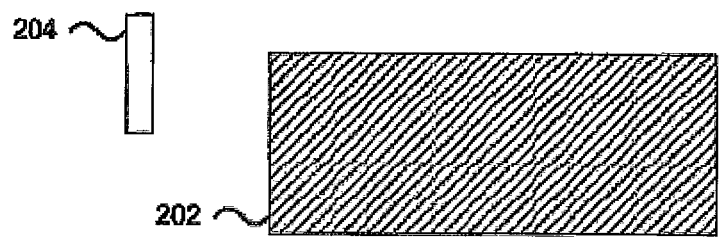
FIG. 2A depicts an initial configuration of a cutting tool relative to a workpiece.
Figure 2B:
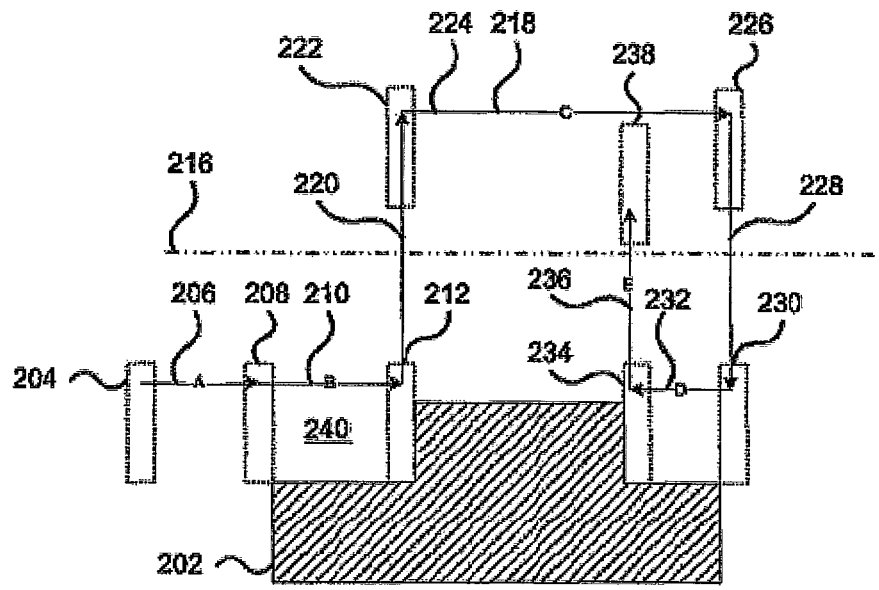
FIG. 2B depicts cutting and positioning paths for producing a part from the workpiece.
Figure 3:
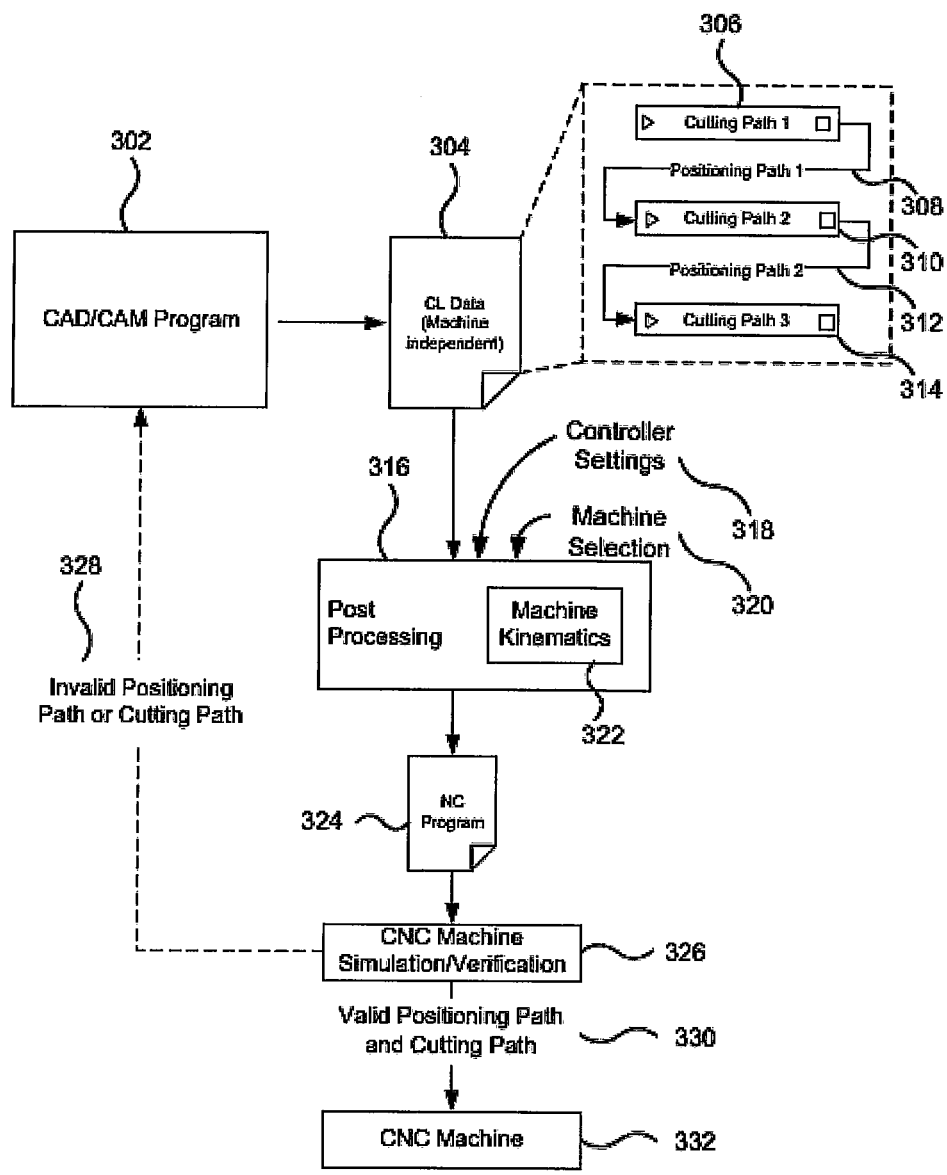
FIG. 3 depicts the process of designing and producing a part on a CNC machine.
Figure 4A:
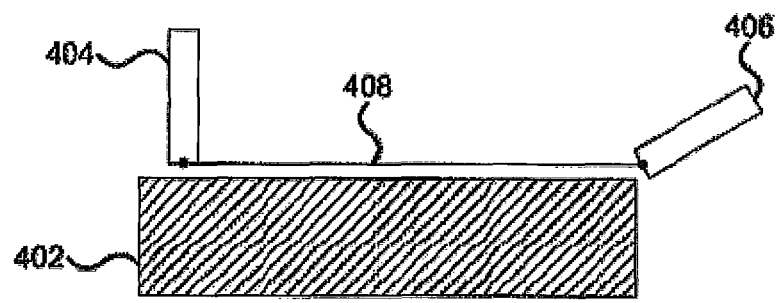
FIG. 4A depicts a positioning path in workpiece coordinates.
Figure 4B:
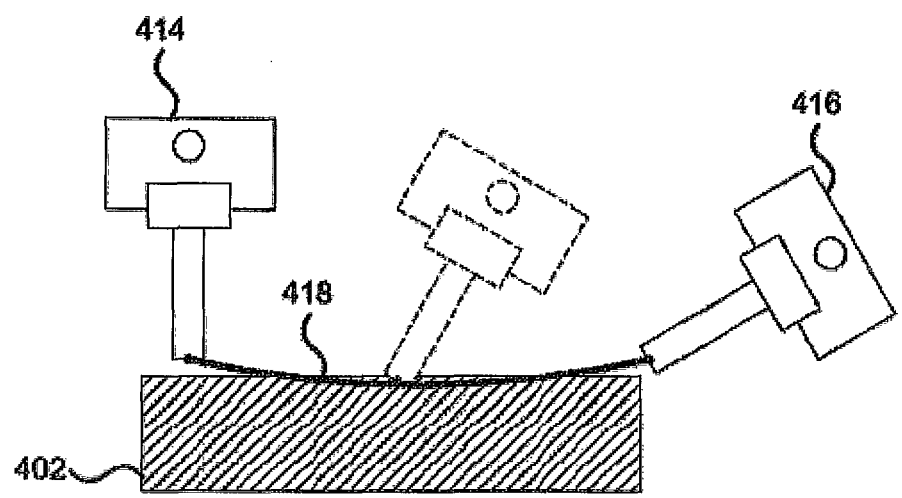
FIG. 4B depicts the positioning path of 4A accounting for machine kinematics.

FIG. 4A depicts a positioning path in workpiece coordinates. The positioning path comprises a start configuration of the tool 404 relative to the workpiece 402 and a goal configuration of the tool 406. The configuration includes both the position and orientation of the tool. In workpiece coordinates, which do not consider how the tool movement is actually implemented, the positioning path between the start and goal configuration is a linear path 408. However, if the positioning path is implemented on a CNC machine, the actual path the tool traverses between the start and goal orientations may not be linear. FIG. 4B depicts the positioning path of 4A accounting for machine kinematics. As depicted, the tool moves between a start configuration 414, corresponding to configuration 404, to a goal configuration 416, corresponding to goal configuration 406. However, the combination of the linear and rotational movement between the two configurations results in a non linear path 418, which may result in unintended movement of the tool and possible collisions with the workpiece or other objects in the machining scene.

Machine kinematics affect both cutting paths and positioning paths. However, cutting paths that involve both a change in the orientation and location of the tool are typically very short, and as such the kinematics do not change the desired tool path by a large amount. In contrast, positioning paths may change orientation and location over a long distance and as such the deviation of the tool path may be greater.

The generation of safe, or valid, positioning paths is described further herein. An unsafe, or invalid, path may be a path that violates a constraint. For example, a positioning path may be invalid if the tool contacts the objects in a machining scene such as the workpiece, fixtures, setups, holding devices or a structure of the CNC machine. Constraints may result from the CNC machine. For example, tool paths may be invalid if they move more than the maximum travel amount for an axis, or contact parts of the machine. Constraints may be dependent upon the part being machined, for example, positioning paths may be invalid if they contact part of the workpiece. Further, constraints may be user specified, for example, a path may be invalid if a tool comes within a defined safe distance of the workpiece when travelling at a rapid rate such as during positioning movements. As described further herein, valid positioning paths that conform to machine constraints can be automatically generated based on machine characteristics such as the machine kinematics, machine velocity and acceleration, and machine positioning methodology. Since the positioning paths are automatically generated taking into account the machine characteristics, it is possible to generate the positioning paths without requiring the user to perform any trial and error.

As described further herein, automatically generating the positioning path, taking in to account the machine kinematics may provide various possible advantages, in addition to providing an alternative technique for generating positioning paths. The automatic generation of the positioning paths for multi-axis CNC machines can reduce the product manufacturing cycle time by eliminating the process of trial and error to adjust and verify multi-axis positioning paths in the CAM application as well as minimizing the unproductive time of the positioning paths based on the machine tool kinematics, machine axes travel limits, machine axis velocity and acceleration limits, and machine positioning methodologies. Further, by automatically generating safe multi-axis positioning paths, which are collision-free based on the actual machine tool kinematics, dynamically changing in-process stock, workpiece setups/fixtures, and machining environment, it is possible to generate machine dependent NC programs for different machines without requiring additional user effort. Accordingly, the machining of a part can be easily changed to different machine types without requiring the user to perform the trial and error process again. Further, the automatic generation of positioning paths can facilitate maximizing part accessibility by searching the machine configuration space and taking full advantage of the CNC machine's work envelope to accommodate multi-axis motions. By automatically generating safe multi-axis positioning paths, the user does not need to define clearance planes or safety zones.

The current disclosure presents devices, system and methods for automatic positioning (i.e. non-cutting) path development and optimization. Automatic path planning for positioning paths is performed to generate optimal safe paths while minimizing non-cutting time, which is unproductive. The positioning paths are developed based on machine tool kinematics, machine axes travel limits, machine axis velocity and acceleration limits, and machine positioning methodologies. The developed positioning paths do not violate machine axes travel limitations and do not cause collisions with the dynamically changing in-process stock of the workpiece and all other surroundings, including fixtures and the moving and non-moving components of the machine. These methods do not require clearance planes or geometric safety zones to be defined by the user. The present methods can apply a safe positioning strategy by respecting a user-specified minimum distance between the tool and other objects in the scene. A predefined retract and approach strategy can also be respected at the start and end of the positioning sequence, where the tool is close or in-contact with the workpiece. Moreover, the contact between the tool and in-process stock can be analyzed to minimize non-cutting time in proximity between tooling and in-process stock so as to eliminate dwells. The result of the optimization will be safe and minimized positioning motions in the machine coordinate system that can be directly run on the CNC machine.

Figure 5:
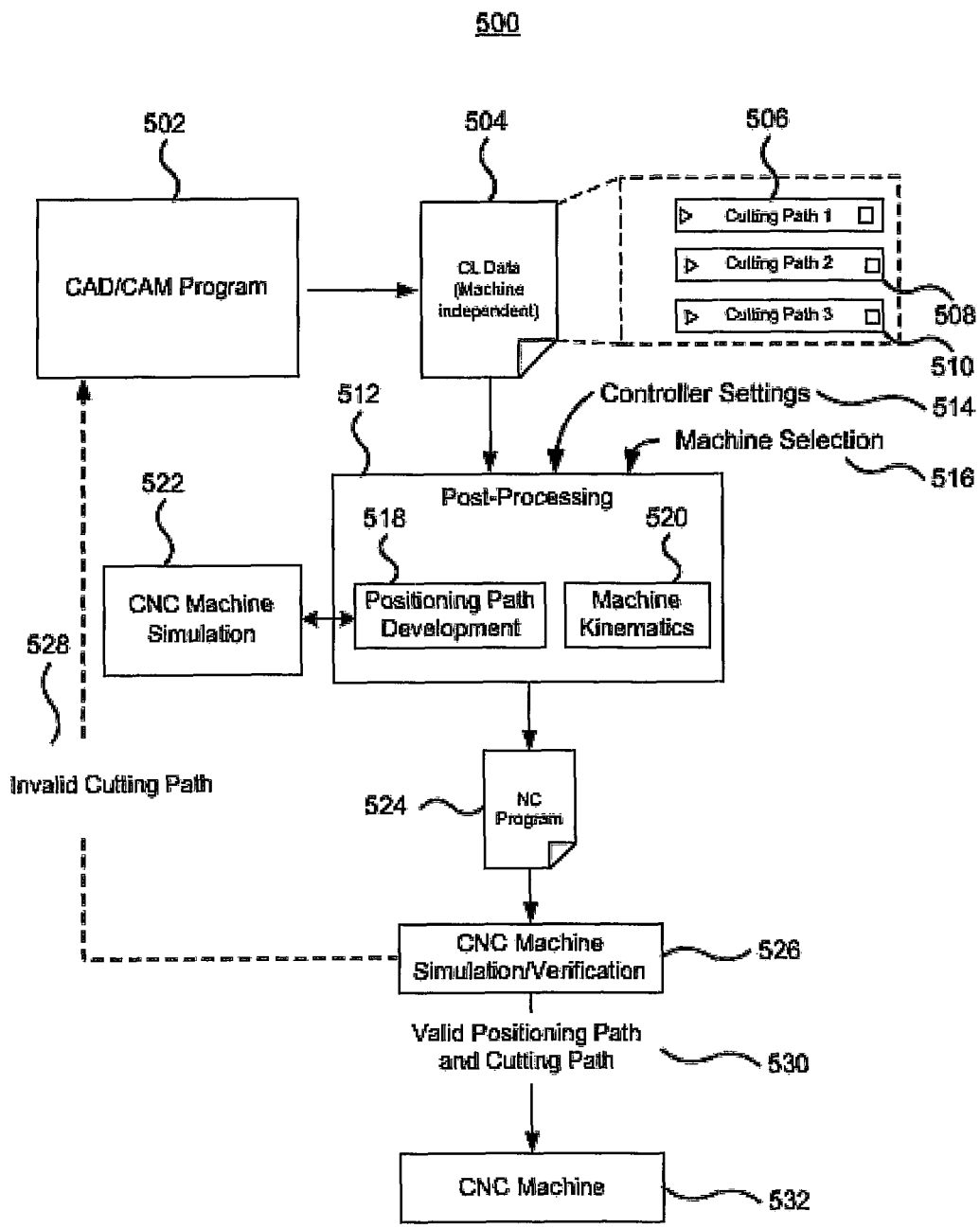
FIG. 5 depicts a process of designing and producing a part on a CNC machine using automatically generated positioning paths.

FIG. 5 depicts a process of designing and producing a part on a CNC machine using automatically generated positioning paths. The process involves generating a 3D model of a part to be manufactured and describes cutter location data (CL Data) for producing the part from a workpiece using CAD/CAM software 502. The CL Data 504 only needs to specify the cutting paths 506, 508, 510 for producing the part. It does not require the user to specify positioning paths. Although depicted as not having any positioning paths, the CL Data may include positioning paths, in which case they are identified and removed or ignored since the positioning paths will be automatically generated.

The CL Data 504 is processed by a numerically controlled (NC) post-processor. The post-processor 512 receives controller settings 514 and an indication of the CNC machine 516 the part will be produced on. In addition to generating NC data for the cutting paths, which may be done using known existing techniques, the post-processing also develops positioning paths 518 for moving the tool between cutting paths. The positioning path development 518 uses the machine kinematics 520 and a simulator 522 of the CNC machine to develop the positioning paths. The post-processor 512 receives the machine independent CL Data and generates the machine dependent NC program 524 for producing the part on the selected machine. The NC program 524 may be run on a CNC machine simulator 526 to ensure the desired performance is achieved. Since the positioning paths have been automatically generated and optimized taking into account the machine characteristics, the positioning paths will be valid. However, it is possible that the cutting paths are invalid, and as such may require adjustment in the CAD/CAM software prior to running the NC program on the physical CNC machine 532. The CNC machine simulators 522, 526 may be provided by the same or separate components. The valid positioning paths and cutting paths 530 may be run by the CNC machine 532 to produce the part.

The post-processing 512 can transform the machine independent CL Data 504 to the machine dependent NC program 524 with little user interaction. The user is only required to specify controller settings as well as select the particular machine the part will be produced on. Accordingly, machining of parts can be easily moved between different machines to meet shop requirements. Further, additional CNC machines can be added to a shop without concern of the effort required to generate NC programs of existing parts for the new machine.

Figure 6:
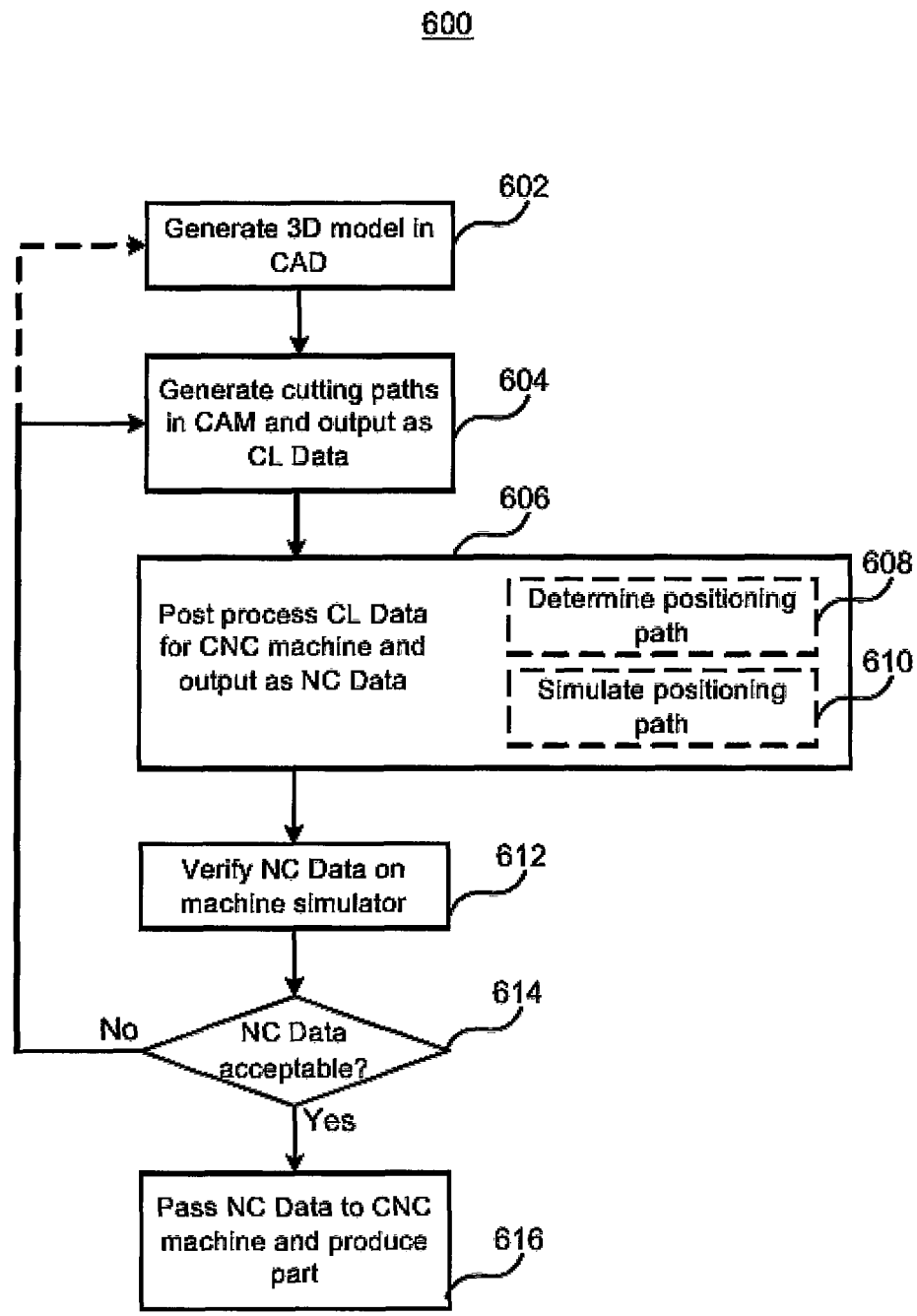
FIG. 6 depicts a method for designing and producing a part on a CNC machine using automatically generated positioning paths.

FIG. 6 depicts a method for designing and producing a part on a CNC machine using automatically generated positioning paths. The method 600 begins with generating a 3D model of the part to be machined (602). The model may be developed in any suitable software application, typically referred to as CAD software. The 3D model is used to generate cutting paths (604) which are specified as cutter locations (CL Data). The cutting paths may be generated by CAM software. The CAD and CAM software functionality may be incorporated into a single software application. The CL Data produced by the CAM software is processed in order to convert the CL data into specific code or instructions for controlling a CNC machine to produce the part, which is outputted as NC data (606). The NC data may form an NC program. The processing of the CL Data converts the cutting paths into specific machine instructions to move the tool along the required cutting paths. Additionally, the processing determines positioning paths (608) and simulates the positioning paths (610) for moving the tool between the cutting paths to verify that the path is valid. Once the CL Data is converted into NC data, for both the specified cutting paths and developed optimized positioning paths, the NC data may be run on a simulator of the CNC machine (612), for example, to verify that the NC Data performs as desired. The method determines if the NC data is acceptable based on the simulator results (614). Although the results may be valid, that is the positioning paths do not cause collisions and do not violate machine travel limits or other constraints, they may still be considered unacceptable. For example, a user may determine that a cutting path does not produce the desired result. If the NC data is acceptable (Yes at 614), that is it produces the desired results without violating any constraints, the NC data may be run on the CNC machine to control the CNC machine in order to produce the part (616). If the NC data is not acceptable (No at 614), that is it does not produce the desired results or violates a constraint, the method may return to generating the cutting paths (604) or the model itself (602) to produce the desired results.

Figure 7:
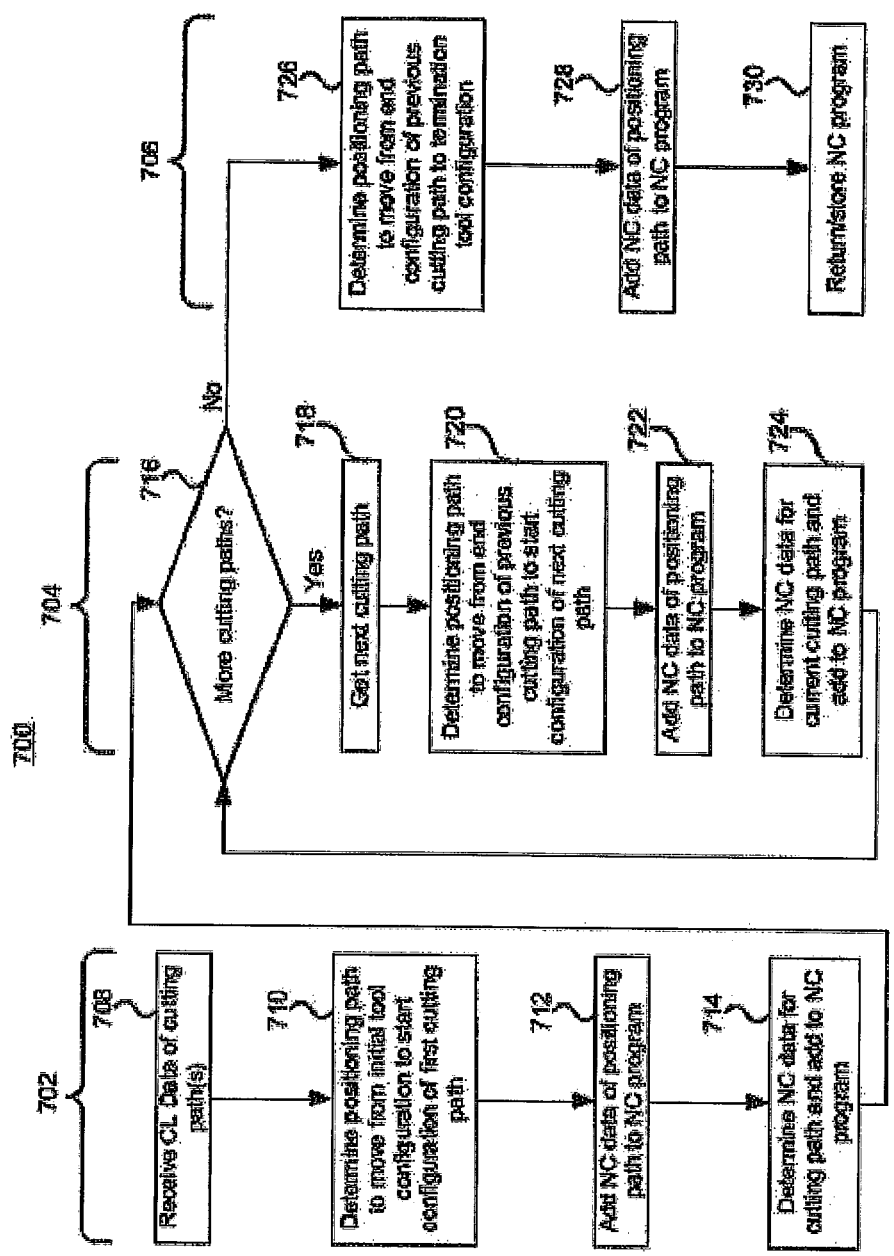
FIG. 7 depicts a method of generating an NC program for machining a part.

FIG. 7 depicts a method of generating an NC program for machining a part. As depicted, the method 700 has 3 broad sections. The first 702, generates NC data for moving the tool from an initial or home configuration to the start configuration of the first cutting path, as well as the NC data for the first cutting path. The second section 704 generates positioning and cutting path NC data for the remaining cutting paths. Finally 706, the method generates the NC data for moving the tool from the last cutting orientation to a finishing orientation, which may be the home orientation. The method 700 receives CL Data specifying one or more cutting paths (708). If the received CL Data also specifies positioning paths, they may be removed or ignored. A positioning path is determined for safely moving from an initial machine configuration to a start configuration of the first cutting path (710). Once the positioning path is determined, the NC data of the positioning path is added to the NC program (712). The NC data for the cutting path is determined and added to the NC program (714). The method determines if there are additional cutting paths (716) and if there are (Yes at 716) the next cutting path is retrieved (718). A positioning path for moving from the end configuration of the previous cutting path to the start configuration of the retrieved cutting path is determined (720). The NC data of the positioning path is determined and appended to the NC program (722). The NC data for the current cutting path is determined and appended to the NC program (724), and again it is determined if there are further cutting paths to process (716). If there are no more cutting paths (No at 716), the method determines a positioning path to move the tool from the end configuration of the last cutting path to a termination machine configuration (726), which may be the same as the initial machine configuration. The NC data for the last positioning path is appended to the NC program (728) and the NC program is returned or stored (730).

Figure 8:
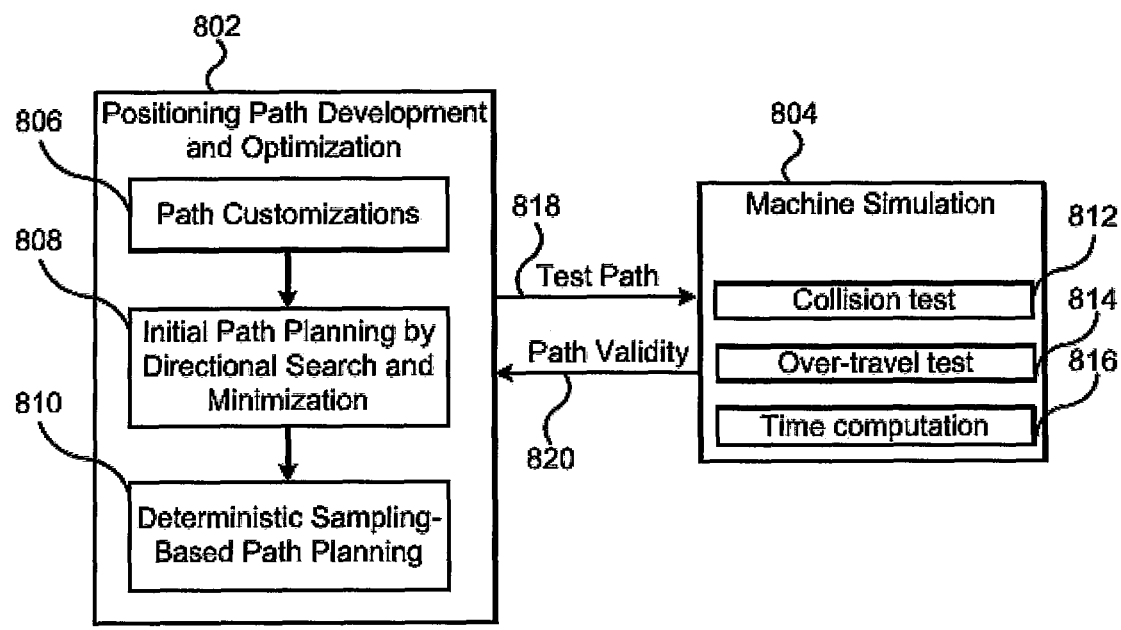
FIG. 8 depicts a method of automatically generating positioning paths.

FIG. 8 depicts automatically developing positioning paths. Positioning path development and optimization 802 functionality generates optimized and valid positioning paths between a start configuration of the machine and a goal configuration of the machine. As shown in FIG. 8, the positioning path development and optimization functionality 802 relies on machine simulation functionality 804. The simulation functionality 804 is used by the path development functionality 802 to simulate tool motion based on the machine tool kinematics and positioning methodologies, such as tool tip programming and etc. The machine simulation functionality 804 includes functionality to perform a collision test 812, functionality to perform a travel test 814, and functionality for performing a travelling time computation 816. The use of the simulation functionality 804 allows the path development process to remain generic and independent of the machine characteristics. Machine simulation functionality 804 can be provided by any of available products or components that provide functionality of collision test 812, travel test 814, and travelling time computation 816. The simulation should be able to precisely simulate a motion in machine space based on machine kinematics, machine velocity and acceleration, and machine positioning methodology in order to check if positioning paths violate machine axis travel limitations and causes collisions with dynamically changing in process stock of the workpiece and all other surroundings, including fixtures and the moving and non-moving components of the machine to provide proper test results. The path development and optimization functionality 802 relies on simple collision test queries (i.e. yes/no queries). The positioning path development and optimization functionality 802 does not require distance computation or other computationally expensive collision test strategies to be performed by collision test functionality 812.

As depicted, the automatic kinematic-based development and optimization of positioning paths 802 involves three major stages. The input to positioning path development functionality 802 comprises an initial start configuration of the tool and goal configuration of the tool, along with a selection of the machine kinematics and different controller settings. The position path development and optimization utilizes path customization functionality 806 to initially customize start and goal configurations according to user preferences. Initial path planning by directional search and minimization functionality 808 is used to provide, or attempt to provide, an initial positioning path between the customized start and goal configurations. Deterministic sampling based path planning functionality 810 uses a sampling based approach to optimize the positioning path between the start and goal configurations.

Initially, the start and goal configurations are provided to path customization functionality 806. To accommodate user requested customization options, positioning paths are first planned at the initial start and goal configurations. These paths are then saved and their end configurations become the new start and goal configurations. Accordingly, the path customization functionality 806 adjusts the start and goal configurations and the adjusted configurations are used in subsequent stages of the path development functionality.

The initial path planning functionality 808 uses a directional search method to find a suboptimal solution for the path planning between the start and goal configurations, which may have been adjusted by the path customizations functionality 806. The initial path planning functionality attempts to quickly find an initial solution to the path planning by searching in the machine space in some potentially good directions. The result from this stage is a positioning path between the start and goal configurations; however, this path may not be the best. Additionally, the initial path planning functionality may fail to find a valid path between the start and goal configurations.

The adjusted start and goal configurations and the solution path found by the initial path planning functionality 808 are provided to the sampling based path planning functionality 810.

An anytime strategic and deterministic sampling-based search technique is used to attempt to find a better positioning path between the start and goal configurations. The initial path may be used by the deterministic sampling based path planning functionality 810 in order to reduce the amount of time required to find a positioning path between the start and goal configurations. However, the deterministic sampling based path planning functionality 810 can still find a valid positioning path even if no initial positioning path was found.

As depicted in FIG. 8, the positioning path functionality 802 provides a test path 818 to the machine simulation functionality 804, which may test the path to determine if it is valid. The test path can be validated using the collision test functionality and the over-travel test functionality. The machine simulation functionality may return the result of the path validity 820 to the position path development. Although not depicted in FIG. 8, the machine simulation functionality 804 may also be used to provide an amount of time a particular machine will require to perform the test path.

Figure 9:
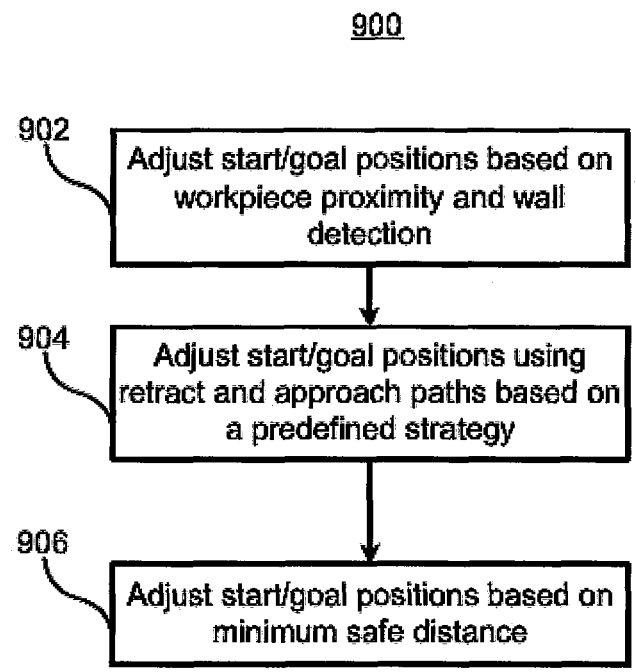
FIG. 9 depicts a method for customizing a positioning path.

FIG. 9 depicts a method for customizing a positioning path. The path customization options may include three major options. The path customization method 900 adjusts the start and goal configurations based on workpiece proximity and wall detection (902). When the start and goal configurations are passed to proximity and wall detection, it checks whether the tool is in contact with the in-process stock or beside a wall. This is checked using a collision test to verify if the tool will collide with the in-process stock. In the case that the tool is in contact with the in-process stock or beside a wall, a feed motion is generated to minimize the non-cutting time in the proximity between the tool and workpiece so as to eliminate dwells. In the wall case, it is desirable to avoid moving along directions along which the tool may leave unwanted dwelling marks on the final part surface. Thus, the start and goal configurations are adjusted to disengage the tool from the contact with in-process stock along a direction that is not in touch with the in-process stock. The path for adjusting the start and goal configurations path will then be outputted as a feed motion which can be used in the NC program for generating the part. The adjusted start and goal configurations are further adjusted using retract and approach paths based on a predefined strategy at these positions (904). An example can be generating a path along a user-defined direction or tool axis direction at these positions. These paths can be outputted as rapid or feed motions based on the user request. The safety of these paths is verified by simulation before they are saved. The further adjusted start and goal positions are again adjusted based on minimum safety distance (906). The purpose for this option is designing a path that does not put the tool closer than a minimum distance to any objects in scene. In order to achieve this, an offset tool having an offset distance based on the required minimum safety distance is created and used in simulation to verify the path safety. This will cause the paths that are closer to the objects than the minimum safety distance to be declared as unsafe paths and skipped by the path planning algorithms. However, the minimum safety distance option needs to find a position at start and goal that accommodates the larger offset tool before the path planning commences.

Figure 10A:
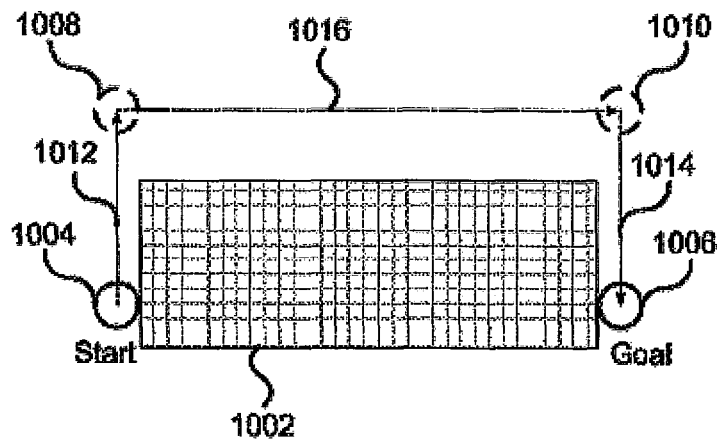
Figure 10B:
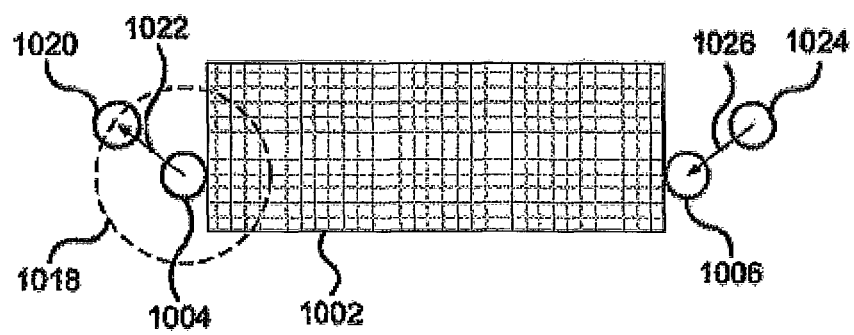

FIGS. 10A, 10B, 10C, 10D depict positioning path customizations. AG. 10A depicts the initial start and goal configurations 1004, 1006 relative to the workpiece 1002. As depicted, additional configurations 1008, 1010 are determined in establishing a positioning path, comprising movements between configurations 1012, 1014, 1016. FIG. 10B depicts adjusting the start and goal configurations 1004, 1006. The adjustment to the start and goal configurations may be done in the same manner. A sphere, depicted as circle 1018 in FIG. 10B, with a small radius is firstly established at a tool center. The sphere 1018 surface is sampled for XYZ coordinates while the tool orientation is kept constant. The samples are searched to determine if moving the tool to the point 1020, for example along path 1022, does not cause the tool to be in touch with in-process stock 1002. Samples for a specific sphere radius are collected and the motion between current tool position and these samples is verified by simulation functionality. The acceptable motion is the one along which the tool does not touch the in-process stock except at the current tool position. If all motions fail, it means none of the samples on the sphere could direct the tool along a good direction with the current sphere radius. New samples should then be collected from the sphere. Samples on the sphere can be controlled by their angles with respect to the tool axis direction. Once all samples for a constant sphere radius have been tested with no success, the sphere radius is increased incrementally and the described steps are repeated to find a solution. The best solution is the one that is found by the minimum sphere radius. The result is a path 1022, 1026 with the length equivalent to the sphere radius. Alternatively, a user-determined length can also be applied along the best direction on the sphere.

FIG. 10C depicts adjusting the configurations 1020, 1024 to use retract and approach paths. The adjusted start and goal positions 1020, 1024 are used to develop retract and approach paths based on a predefined strategy at these positions. For example, the retract and approach paths can be generated along a user-defined direction or tool axis direction at these positions. These paths can be outputted as rapid or feed motions based on the user request. The safety of these paths is verified by simulation before being saved or outputted. The result from adjusting the configurations using retract and/or approach paths will be new positions 1028, 1032 based on the implemented retract/approach strategy at the start and goal.

As depicted in FIG. 10D the start and goal positions 1028, 1032 may then be adjusted in order to account for a minimum safety distance option. The minimum safety distance option designs a path that does not put the tool closer than a minimum distance to any objects in scene. In order to achieve this goal an offset tool 1036 having an offset based on the minimum safety distance is created and used in simulation to verify the path safety. A similar type of search using a sphere as described above with regard to FIG. 10B may be used to adjust the start and goal configurations along paths 1040, 1044 in order to accommodate the larger offset tool, however, the larger offset tool is used in order to test the safety of the motions. The result from this algorithm will be new positions 1038, 1042 at start and goal configurations that accommodate the larger offset tool. Now, the path planning can be performed using the larger offset tool to guarantee the user requested safety.

As described above, the start and goal configurations can be adjusted to account for user customizations. Although described as performing all of the customizations, it is contemplated that one or more of the customizations can be applied without applying all of the customizations. The adjusted start and goal configurations can be used in determining the positioning path. An initial positioning path is first determined and then used in determining an optimized positioning path.

Figure 11:
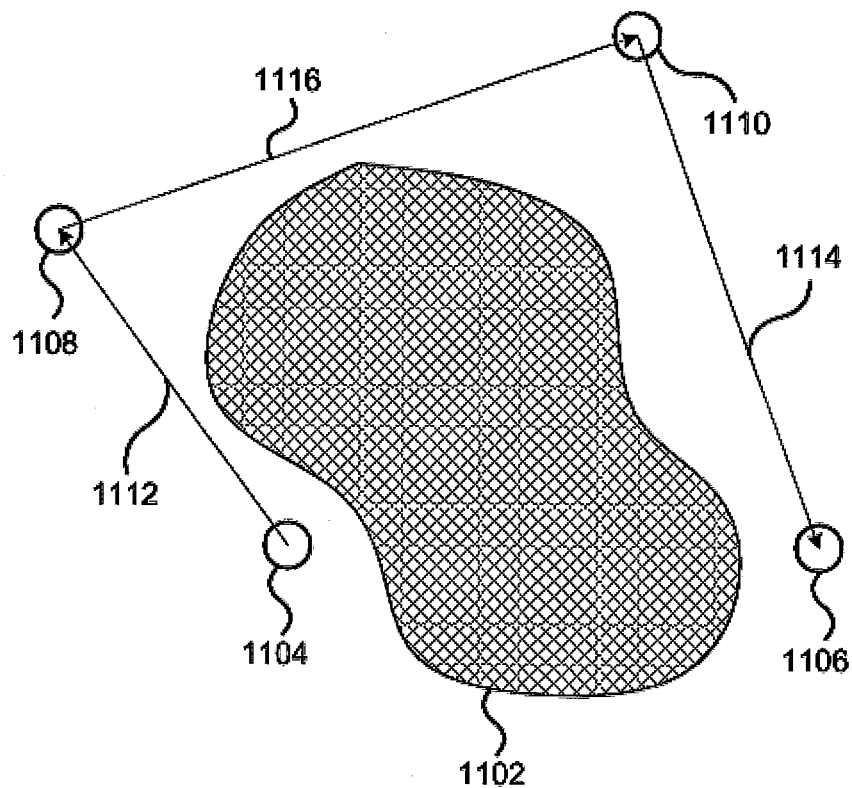
FIG. 11 depicts an initial positioning path.

FIG. 11 depicts an initial positioning path in the machine configuration space. It is noted that the machine configuration space depicted in FIG. 11 is 2 dimensional. It will be appreciated that the machine configuration space will typically be of a higher dimension, such as 3, 4, 5 or higher dimensions. However, the drawings are depicted in 2D in order to facilitate the description. One of ordinary skill in the art will readily appreciate how to apply the teachings to higher dimensions. The initial positioning path may be developed by a directional search and minimization using the start and goal configurations in order to plan a path between them. These configurations can be the ones determined by user customization options as described above, or may be the un-adjusted start and goal configurations. The path planning problem for multi-axis machining is a multi-dimensional problem depending on the number of active axes on the machine. In general, solving such a problem may become time-consuming. The initial positioning path is determined by reducing the problem dimension by a constrained search along some predefined directions to find a suboptimal solution for the problem. The positioning path development strategy used here comprises three movements of the tool in the machine space. The positioning path moves along path 1112 to an intermediate configuration 1108, along path 1116 to another intermediary configuration 1110, and finally along path 1114 to the goal configuration 1106. As depicted in FIG. 11, the positioning path 1112, 1114, 1116 do not pass through the obstacle zone 1102, which may be for example the in-process workpiece. All configurations in the obstacle region 1102 violate the planning requirements so they are not acceptable. In the first step in developing the initial positioning path, an intermediary configuration 1108 is found by moving 1112 the tool along a predefined direction in machine space, such as tool axis direction, from the start configuration 1104 without changing the orientation of the tool. In the second step, the intermediary configuration 1110 is determined by moving 1114 along a predefined direction in machine space, such as tool axis direction, from the goal configuration 1106.

In the third step, the intermediary configurations 1108 and 1110 are connected 1116. Since the tool axis directions at the intermediary configuration 1108 and the start configuration 1104 are the same, as are the tool axis directions at intermediary and goal configurations 1110, 1106, machine rotary values remain the same at these configurations as well. Therefore, the distances between start and intermediary configurations 1104, 1108 as well as intermediary and goal configurations 1110 and 1106 are Euclidian distances in machine space and are called ds and dg respectively. In order to plan a path between start and goal configurations 1104, 1106 ds and dg must be specified. A two-dimensional minimization can be devised to identify ds and dg values that minimize the travelling time while still generating a valid path. The problem dimension can be reduced further by an insignificant compromise of the solution quality. It can be assumed that ds=dg=d. The minimization can then be performed by a 1-D search method, such as the golden section search method, to minimize the travelling time by reducing d value. The solution is a d value that minimizes the travelling time and connects the start and goal configurations 1104 and 1106 while respecting all the defined constraints. The result from the 1D search is an optimized path along the predefined directions. This path is a local solution to the path finding problem and can be found quickly.

Once the initial positioning path is determined, an optimized path can be developed using a sampling based approach as described further below. A number of samples are obtained from the machine space, which are used to build a graph of possible positioning paths between the start and goal configurations.

Figure 12:
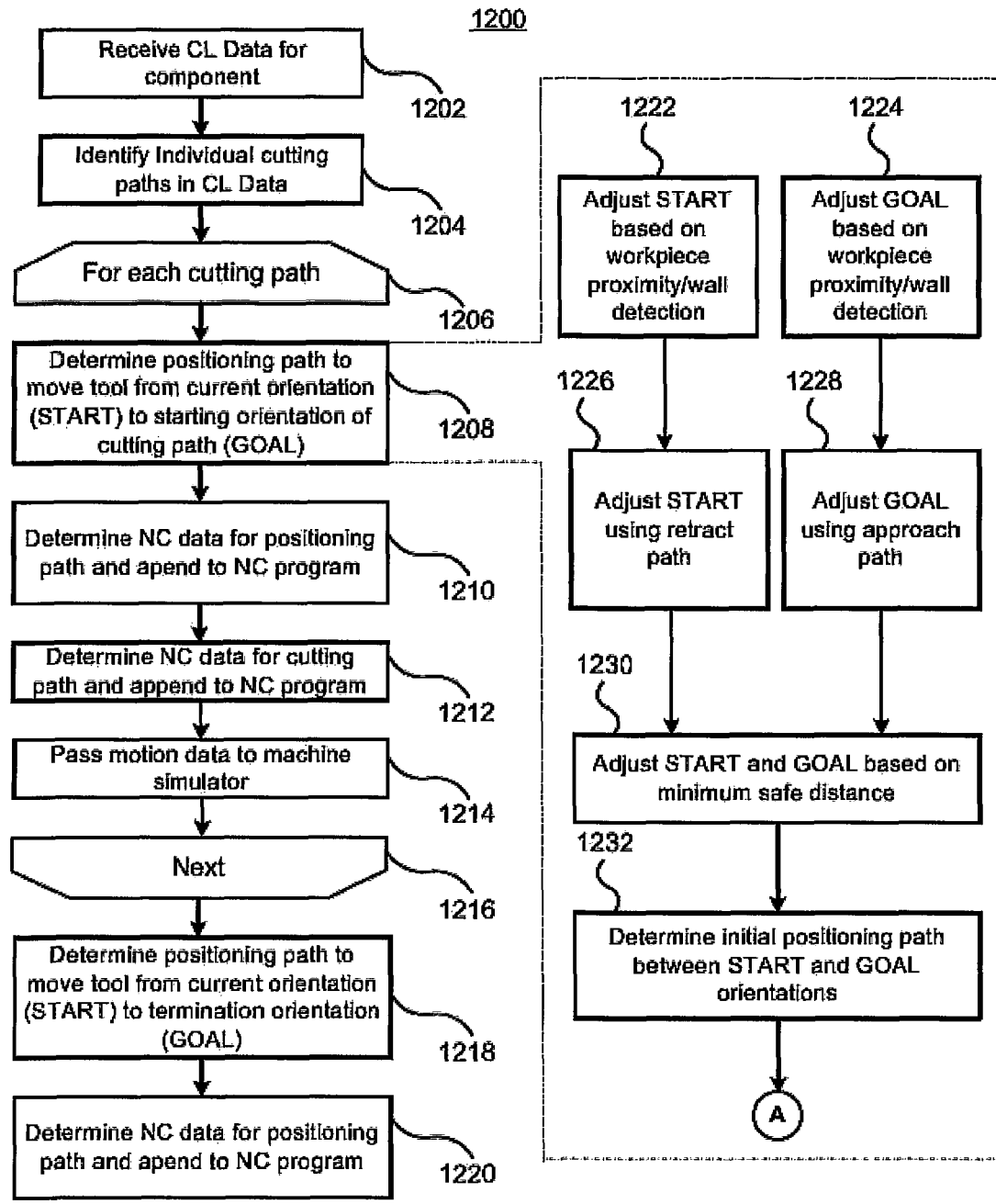
FIG. 12 depicts a further method of developing an NC program.
Figure 12:
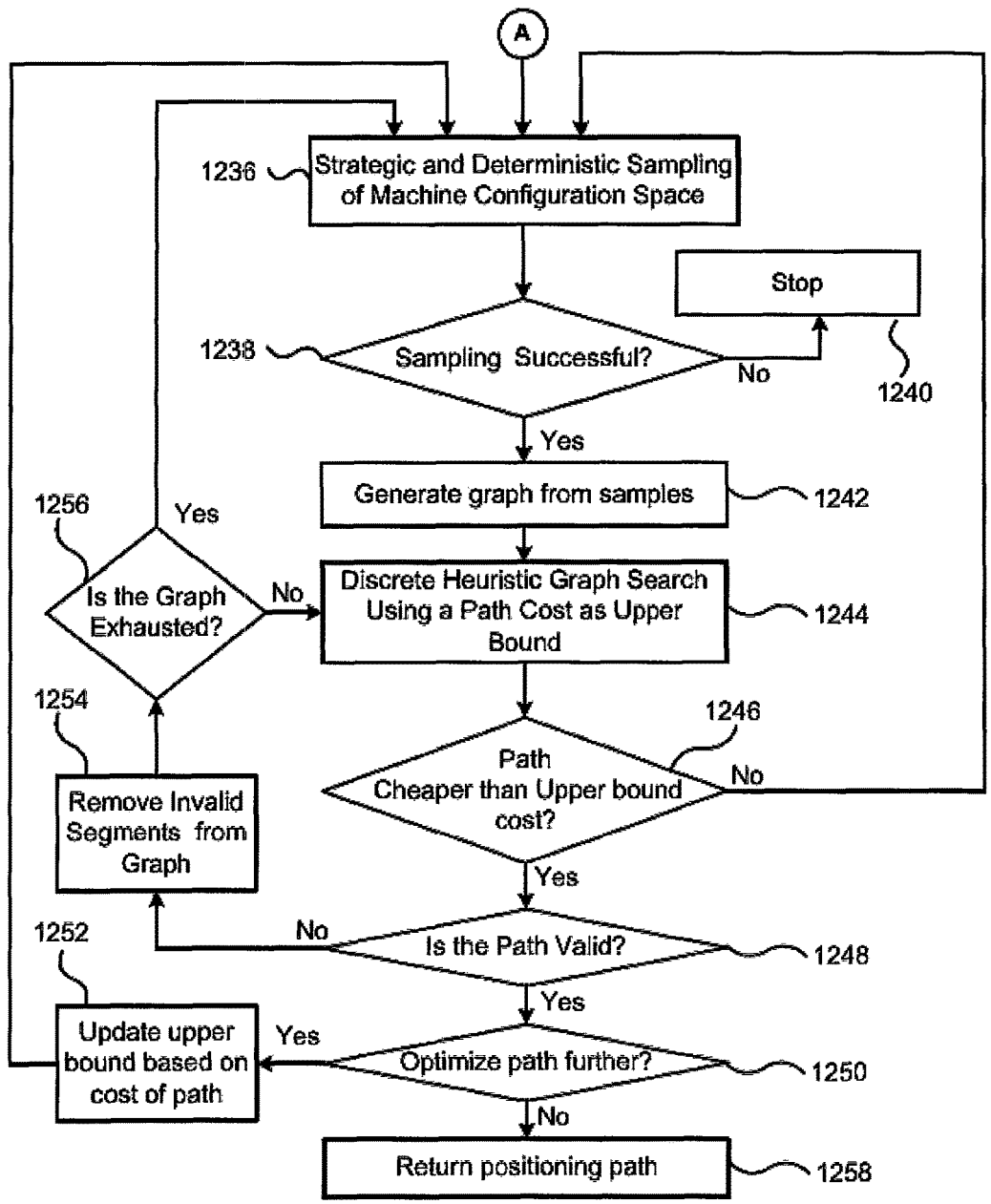

FIG. 12 depicts a further method of developing an NC program. The method 1200 receives CL Data for producing a component (1202), and identifies the cutting paths in the received CL Data (1204). For each of the identified cutting paths (1206) a positioning path is determined to move the tool from a current configuration to a goal configuration (1208). NC Data is determined for the positioning path and the NC Data is appended to an NC Program (1210) for generating the component. NC Data for the cutting path is appended to the NC Program (1212). Motion data describing the cutting and positioning paths is provided to the simulator (1214) which uses the motion data to update the simulated workpiece in accordance with the cutting path. The configuration is updated to the stop configuration of the cutting path, and the next cutting path is processed (1216). A positioning path is determined to move the tool from its current configuration to an end configuration (1218), such as a home configuration of the machine. NC data for the final positioning path is determined and appended to the NC Program (1220).

As depicted, determining the position path between a start configuration and a goal configuration may involve adjusting the start configuration based on workpiece proximity wall detection (1222) and the goal configuration (1224). The start and goal configuration can be selectively adjusted independently of each other. The start configuration can be adjusted using a specified retract path (1226) and the goal configuration can be adjusted using a specified approach path (1228). Again, these start and goal configurations can be selectively adjusted independently of each other. The start and goal configurations can be adjusted based on minimum safe distances (1230) if required. The start or goal configuration may already accommodate the larger offset tool, in which case the configuration will not change; however, the configurations still need to be checked against the larger offset tool. When adjusting the start and goal configurations for a minimum safe distance, both the start and goal configurations must be considered so that the larger offset tool will not contact the workpiece at either the start or the end configurations.

Once the start and goal configurations are adjusted, an initial positioning path is determined that moves from the adjusted start configuration to the goal configuration (1232). The initial positioning path may be determined as described above. The initial positioning path is associated with a time-cost. Time-costs of paths may be determined using a simulation of the machine or may be determined based on available information of the machine. For example, if the maximum velocity of travel along the different machine axes is known, the time-cost may be estimated using the velocities and distance of the path. The simulation may provide a more accurate time-cost estimate by, for example accounting for the acceleration along the machine axes.

Once the initial positioning path is determined, an optimized positioning path, that is a positioning path that takes less time to complete, is determined. The positioning path is determined using a sampling based technique. A strategic and deterministic sampling of the machine space is determined (1236). The solution quality and efficiency of a sampling-based path planner depends on how well the planner samples the configuration space. Sampling with fine resolutions may result in a more optimal path but it also increases the computation time. In order to achieve a balance between the performance and the path quality, a strategic and deterministic sampling method is used.

Figure 13:
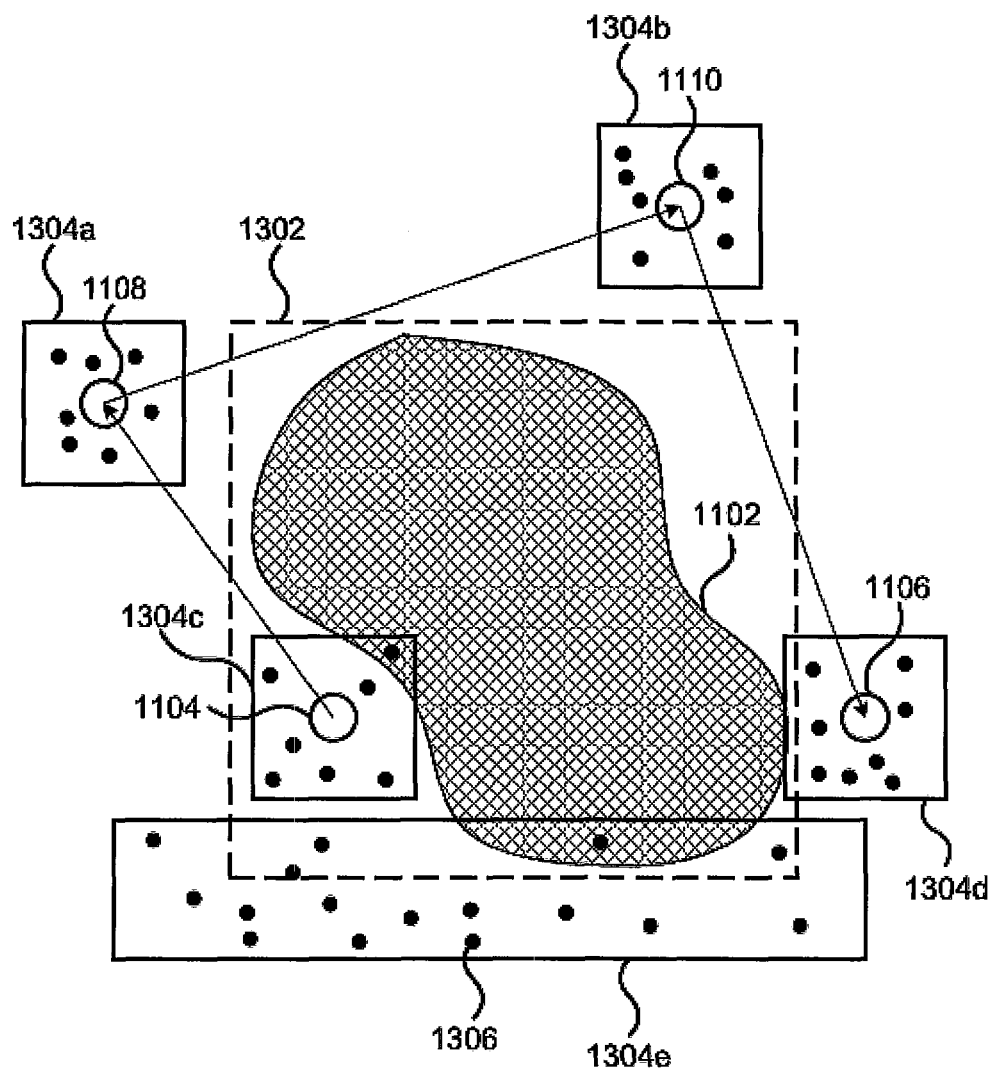
FIG. 13 depicts sampling of machine space for developing a positioning path.

FIG. 13 depicts sampling of machine space for developing a positioning path. The drawing depicts the sampling in 2D in order to facilitate the description. One of ordinary skill in the art will readily appreciate how to apply the teachings to higher dimensions. Strategic and deterministic sampling (1236) is performed by individual sampling of each axis of motion. Strategic regions surrounding relevant features of a machining scene are identified for sampling. Sample configurations are taken from the identified regions for each axis. These regions surrounding relevant features of the machining scene may include regions 1304*c*, 1304*d* surrounding start and goal configurations 1104, 1106, regions 1304*a*, 1304*b* surrounding optimal configurations 1108, 1110 from a known positioning path, and regions 1304*e* surrounding bounding boxes of scene objects, one of which 1302 is depicted in FIG. 13, including the workpiece, fixtures, setups clamps, holding devices, machine parts etc. These bounding boxes may be provided from the simulation of the CNC machine and can be used to improve the sampling quality. Each axis of motion has a minimum and maximum value based on the machine travel limits. The region between the axis minimum and maximum is divided into different spans using locations corresponding to the start and goal configurations. Sample configurations depicted as black dots, one of which is referenced as 1306, are collected from the identified regions. Each span is then checked to verify if it has been sampled by the strategic locations. More samples can be collected from a span, if a large section of it has not been sampled. A minimum sampling resolution defines the minimum possible difference between the samples along each axis. The method determines if the sampling was successful (1238). If the axis cannot be sampled with the specified resolution anymore (No at 1238), the sampling is declared unsuccessful and if the samples cannot be sampled at a lower resolution, the process ends (1240). If the strategic and deterministic sampling (1236) did not sample the machine axis at the minimum sampling resolution, the resolution may be reduced and additional samples determined. Although the above has described the use of deterministic sampling to obtain samples from identified regions, it is contemplated that other sampling techniques may be used. For example, random sampling of the machine space may be used; however such sampling may result in the consideration of a larger number of samples and as such may require additional computation time to determine the path.

If the sampling was successful (Yes at 1238), the collected samples 1306 for each axis are used to build a search graph (1242). The locations of the collected samples on each axis are used to build a grid network of samples as a search graph. The grid network is built based on a neighborhood definition. In general a neighbor of a configuration Q can have 1 to P coordinates differing from those of Q, where P is the space dimension. For example in a 2D space (i.e. P=2) for a point Q, a total of eight neighbors can be defined. Four of these neighbors have one coordinate different from Q and the other four have two coordinates different from Q. Once the neighborhood is defined, the grid network of samples is created by connecting neighboring sampled locations. The grid network is then provided as a search graph. The generated graph is then searched using a discrete heuristic search method such as A* (1244). The A* search finds a minimum cost path in the graph between start and goal configurations. The cost of the known solution is used in the A* algorithm as an upper bound for the solution. Thus, the A* algorithm becomes faster by pruning out those nodes that would result in a more expensive path than the known solution.

The result of performing the graph search is either a path cheaper than the known solution or no path. The method determines if there is any path through the graph provides a cheaper path than the initial path. No path may be found when all possible paths through the graph nodes between start and goal are more expensive than the known solution. This means the sampling was not good enough to generate a better solution than the known solution. Therefore, if there are no cheaper paths (No at 1246), more samples may be collected (1236) or attempted to be collected. The strategic sampling may be performed at the previously used sampling resolution, or the sampling resolution may be reduced. At this stage more samples are collected from non-sampled regions of each span along each axis, and if the sampling is successful, a new graph is built including with the new samples (1242). Alternatively, the new samples may be added to the existing graph. Once the A* algorithm identifies a cheaper path than the previous solution, it needs to be checked and verified (1248) by the simulation and verification functionality. If the path is invalid (No at 1248), invalid path segments are identified and removed from the graph (1254). It is determined if the graph is exhausted (1256). If the graph is not able to generate a path between start and goal anymore, it is declared exhausted (Yes at 1256) and processing returns to collect more samples (1236). Otherwise, the graph is not exhausted (No at 1256) and so the graph is searched (1244) to find the next minimum cost path. If the verification reports no problems for the path (Yes at 1248), it is declared valid and the method may determine if the path should be optimized further (1250). If the path is not to be optimized further (No at 1250) the positioning path is returned (1258). If the path is to be optimized further (Yes at 1250), the cost associated with the current positioning path is set as the upper bound (1252) and new samples may be retrieved (1236) in an attempt to find an improved path.

Figure 14:
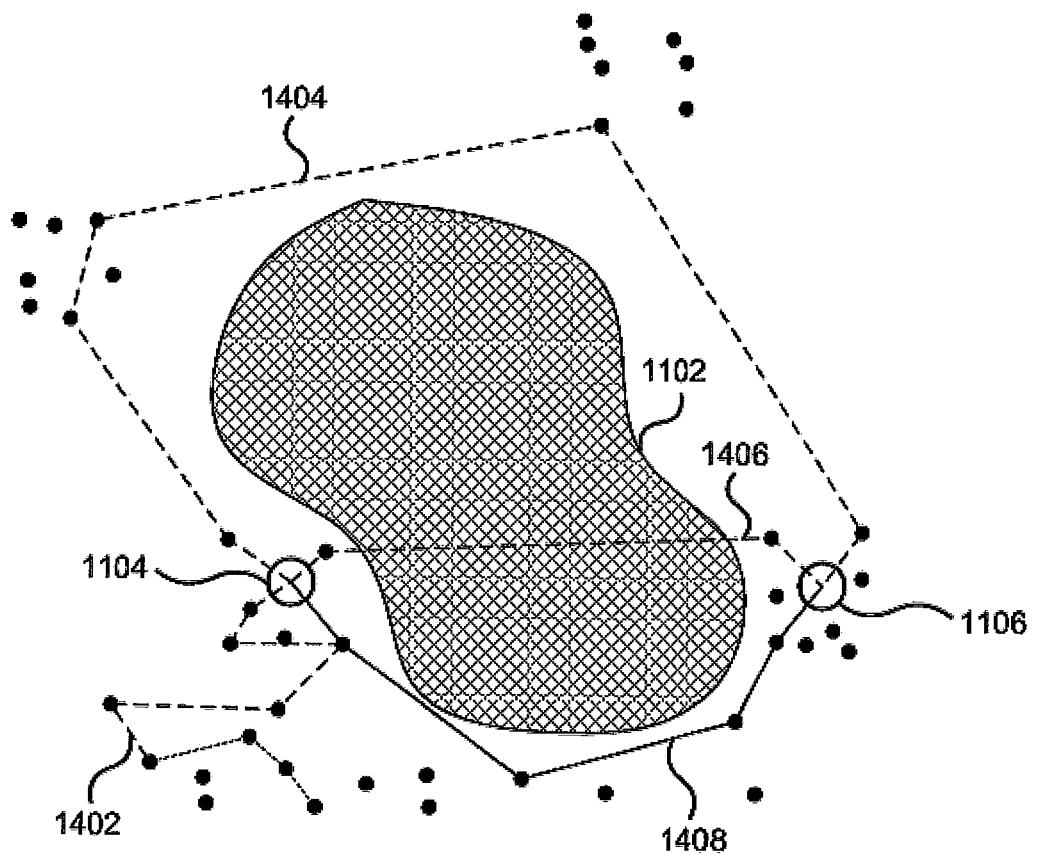
FIG. 14 depicts developing the positioning path.

FIG. 14 depicts developing the positioning path. The drawing depicts the positioning paths in 2D in order to facilitate the description. One of ordinary skill in the art will readily appreciate how to apply the teachings to higher dimensions. A number of potential positioning paths between the start configuration 1104 and the goal configuration 1106 are depicted by dashed lines. Three potential positioning paths are depicted. The first path 1402 may not provide a better positioning path since it may have a higher time-cost than the initial positioning path. Another potential path 1404 may provide a lower cost path; however, it may not provide the lowest cost path of all the valid paths and as such is not optimal. Another possible positioning path 1406 may provide the lowest cost path, however it is not valid as it violates constraints since it requires the tool to move through the workpiece. Finally, the path 1408 is valid since it does not violate any constrains and connects the start and goal configurations. The path 1408 also has a lower time cost associated with it than the initial positioning path and determined positioning path 1404 and as such it provides a better positioning path than the initially determined path. The start and goal configurations 1104, 1106 may be either initially received configurations, or may be the start and goal configurations as adjusted based on optionally specified path customizations.

The above has described automatically generating an optimized positioning path by generating an initial positioning path using a fast directional search and minimization technique. The initial positioning path may then be used to generate an optimized positioning path using a deterministic sampling based approach. Although the initial positioning path may reduce the time required to generate the optimized positioning path using the deterministic sampling based approach, it is not necessary to have an initial positioning path. In such a case, the first valid positioning path found by the deterministic sampling based approach may be used as the upper bound on costs for optimizing the positioning path.

Figure 15:
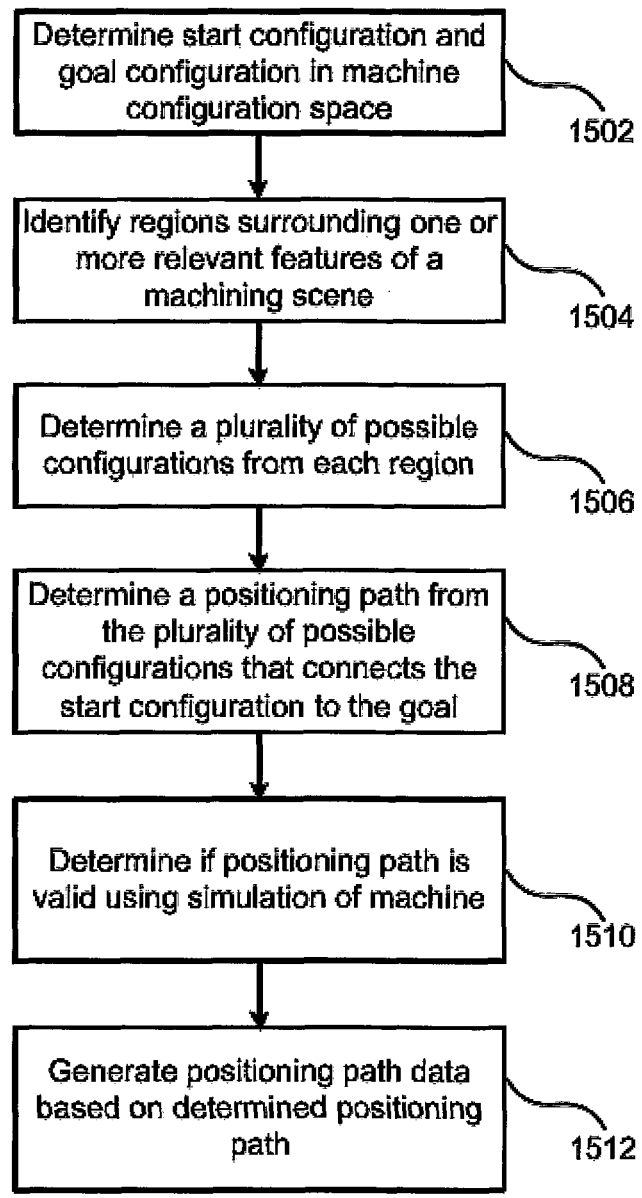
FIG. 15 depicts method for generating positioning paths.

FIG. 15 depicts a method for generating positioning path data for a CNC machine. The method 1500 determines a start machine configuration and a goal machine configuration of a tool in a machine configuration space (1502). Determining the respective machine configurations may comprise translating a received tool location specified in a workpiece coordinate space into the machine space. Further, the machine configurations may be adjusted based on optionally specified customizations of the paths. The method identifies respective regions surrounding one or more relevant features of a machining scene (1504) in the machine configuration space for sampling of possible machine configurations and determines a plurality of possible machine configurations from each of the identified one or more regions in the machine configuration space (1506). The method determines a positioning path from the plurality of possible machine configurations that connects the start configuration to the goal configuration (1508). The path may be determined using various techniques including, for example, a heuristic graph searching technique such as an A* search approach. Once a positioning path is determined, the method determines if the determined positioning path is valid using a simulation of the CNC machine (1510). The simulation of the CNC machine determines if the positioning path violates any machining constraints by simulating the path using the in process stock of the workpiece and machine characteristics, including machine kinematics, machine axis travel velocities and acceleration limits, travel limitations for each control axis, positioning methodologies, workpiece setup, location of machine components or fixtures, and location of clamps. If the positioning path is valid, the method generates positioning path data for moving the tool of the CNC machine along the determined positioning path (1512). The positioning path data may comprise NC data, or may be specified in any other suitable format.

Figure 16:
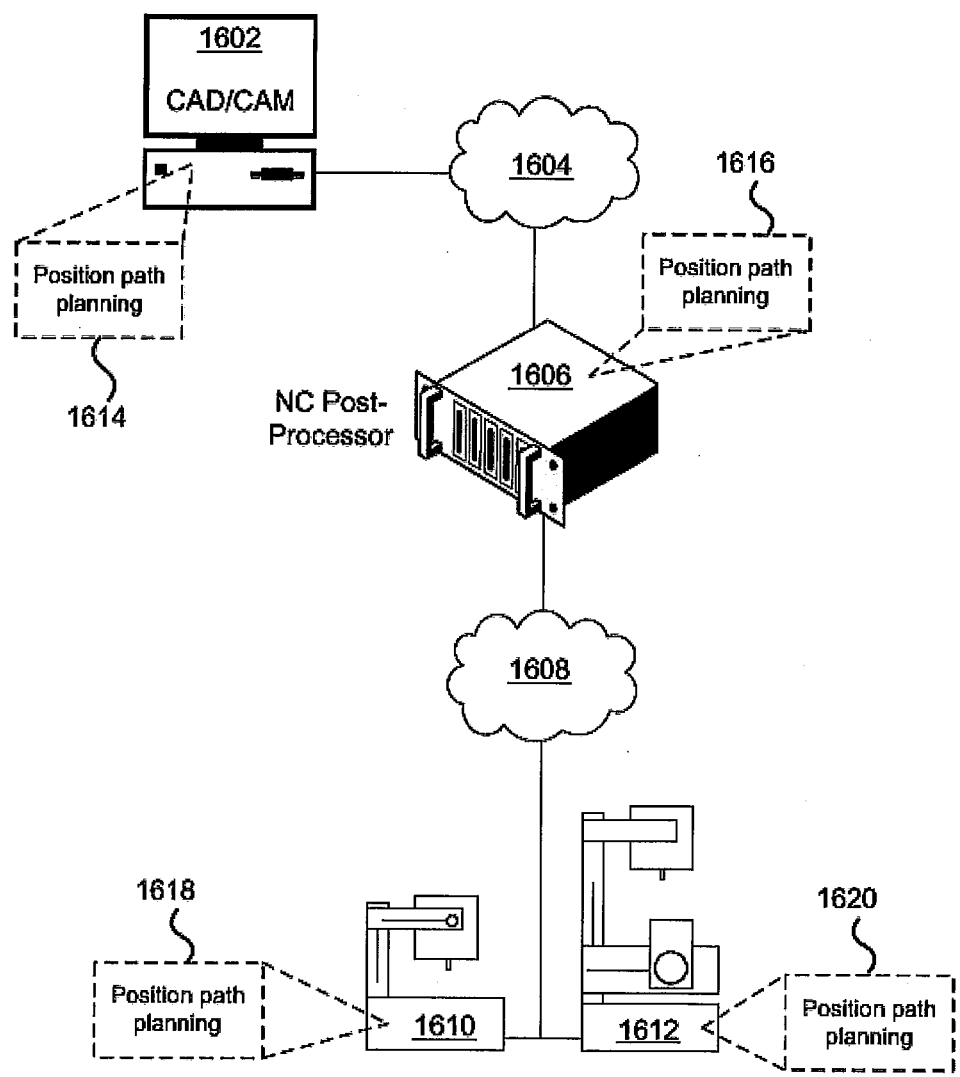
FIG. 16 depicts a system for machining a part.

FIG. 16 depicts a system for machining a part. The system 1600 comprises a CAD/CAM computing device 1602 that is used to specify the geometry of the part to be machined. The CAD/CAM device may be provided by a desktop computer or server or similar computing device. The CAD/CAM computing device 1602 may produce tool path information for machining the part. The tool path information is provided to an NC post-processor computing device 1606. The information may be provided over a network 1604, or may be provided using transferable media or other types of communication suitable for transferring the information from the CAD/CAM computing device 1602 to the NC post-processor computing device 1606. Further, although depicted as being located on separate physical computers, it is possible that the NC post-processor be provided on the same computer as the CAD/CAM software. The NC post processor generates machine specific code for controlling a particular CNC machine 1610, 1612. The machine specific code may be specified as an NC program which may be provided to the particular CNC machine over a network 1608 or other suitable communication means such as a transferrable media.

The NC post-processor may include position path planning functionality 1616 for automatically generating positioning paths for machines based on start and goal configurations and using a simulation of the machine as described above. Additionally, or alternatively, the CAD/CAM computing device 1602 may incorporate similar position path planning functionality 1614 for generating positioning paths as described above within the CAD/CAM device. The NC post processor functionality may be incorporated into the CAD/CAM software in order to simplify the generation of the code for machining the part on a particular CNC machine. As depicted, the automatic generation of the positioning path allows specific code for different types of CNC machines 1610, 1612 to be automatically generated without requiring additional input from the user, other than specifying which CNC machine is to be used. Additionally, or alternatively, the CNC machines 1618, 1620, or more particularly the controllers of the CNC machines, may incorporate similar position path planning functionality 1618, 1620 for generating positioning paths as described above.

The above has described various particular embodiments with regard to generating positioning paths for CNC machines 3, 4 or 5 axis. It is contemplated that the same techniques as taught herein can be applied to other machining devices that incorporate further or additional degrees of freedom. For example, the positioning paths may be generated for machining a part on a CNC machine having 6 axes, or using a robot machining device having more degrees of freedom.

Regardless of if the positioning path planning functionality is implemented in the CAD/CAM computing device, the NC processor computing device or the controller of one of the CNC machines, the positioning path planning functionality is provided by executing instructions stored in a memory using a processor of the respective computing device. The instructions when executed by the processor, configure the computing device to provide the positioning path planning functionality described above.

Although the description discloses example methods, systems and apparatus including, among other components, software executed on hardware, it should be noted that such methods and apparatus are merely illustrative and should not be considered as limiting. For example, it is contemplated that these hardware and software components could be embodied exclusively in hardware, exclusively in software, exclusively in firmware, or in any combination of hardware, software, and/or firmware. Further, the described functionality may be provided as code or instructions stored on transitory or non-transitory media. Further, although certain components or apparatuses are depicted as a single physical component, it is contemplated that they could be implemented as multiple separate components. Further still, it is contemplated that the functionality of multiple separate components described herein could be provided in a single component. Accordingly, while the following describes example systems, methods and apparatus, persons having ordinary skill in the art will readily appreciate that the examples provided are not the only way to implement such systems, methods and apparatus.

Although the present invention has been described in connection with one or more preferred forms of practicing it, those of ordinary skill in the art will understand that many modifications can be made thereto within the scope of the claims that follow. Accordingly, it is not intended that the scope of the invention in any way be limited by the above description.

What is claimed is:

1. A method for generating positioning path data for an NC program for a computer numerically controlled (CNC) machine, the method comprising:
    determining, by a computing device, a plurality of possible paths, each for repositioning a tool from a first configuration to a second configuration;
    determining, by the computing device, for each of the plurality of possible paths if the respective possible path is valid by simulating repositioning of the tool along the respective possible path using a simulation of the CNC machine;
    selecting, by the computing device, as a positioning path one of the plurality of possible paths determined to be valid;
    generating, at the computing device, positioning path data for moving the tool of the CNC machine along the selected positioning path; and
    generating, at the computing device, the NC program comprising the positioning path data for controlling a position of the tool of the CNC machine;
    wherein each of the plurality of possible paths is determined by:
        receiving, at the computing device, the first and the second configurations;
        adjusting, by the computing device, the first and second configurations;
        determining, by the computing device, a new first configuration using a disengage path from the adjusted' first configuration and a new second configuration using an engage path from the adjusted second configuration; and
        determining, by the computing device, a path between the new first configuration and the new second configuration;
    wherein the first and second configurations are adjusted based on at least workpiece proximity and wall detection to a minimum distance in a direction that does not cause the tool to be in contact with a workpiece.

2. The method of claim 1, wherein each of the plurality of possible paths is determined to be valid if the tool does not violate machining constraints during repositioning along the path in the simulation.

3. The method of claim 2, wherein violating the machining constraints comprises one or more of:
    contacting a workpiece with the tool;
    contacting a fixture with the tool;
    contacting a setup with the tool;
    contacting a holding device with the tool;
    contacting a structure of the CNC machine with the tool; and
    contacting or passing through an obstacle zone with the tool.

4. The method of claim 2, wherein violating the machining constraints comprises unacceptable interference between two or more of the tool, workpiece, fixture, setup, holding device, and structure of the CNC machine.

5. The method of claim 2, wherein each of the plurality of possible paths is further determined to be valid if the simulation does not exceed defined CNC machine travel limits.

6. The method of claim 1, wherein the minimum distance is a user-selected length or automatically determined length.

7. The method of claim 1, wherein the disengage path and the engage path are based on a predefined strategy.

8. The method of claim 7, wherein the disengage path and the engage path are respectively along a user-defined direction from the adjusted first and second configurations.

9. The method of claim 7, wherein the disengage path and the engage path are respectively along a tool axis direction from the adjusted first and second configurations.

10. The method of claim 7, wherein the disengage path and the engage path are respectively along the direction of an axis of control of the CNC machine.

11. The method of claim 1, wherein the path between the new first configuration and the new second configuration is determined using a sample-based approach.

12. The method of claim 1, wherein simulating the repositioning of the tool comprises performing one or more of: a collision test, a travel test, and a travelling time computation.

13. The method of claim 12, wherein simulating the repositioning of the tool incorporates machine characteristics into simulating machining on the CNC machine, the machine characteristics comprising one or more of:
    machine kinematics;
    velocity limits;
    acceleration limits;
    travel limitations for each machine axis;
    positioning methodologies;
    workpiece setup;
    location of machine components or fixtures; and
    location of holding devices.

14. The method of claim 12, wherein simulating the repositioning of the tool simulates a dynamically changing workpiece.

15. The method of claim 1, wherein generating the NC program comprises appending the generated positioning path data to the NC program.

16. The method of claim 1, further comprising:
    receiving cutter location (CL) data comprising one or more cutting paths each defining a respective path where the tool is in contact with the workpiece;

generating NC data for the one or more cutting paths; and
appending the NC data for the one or more cutting paths to the NC program.

17. The method of claim 16, wherein the positioning path is defined by any one of:
the first configuration of the tool is a current configuration and the second configuration of the tool is a starting configuration of a cutting path; and
the first configuration of the tool is the current configuration and the second configuration of the tool is an end configuration.

18. A computing device for generating positioning path data for an NC program for a computer numerically controlled (CNC) machine, the computing device comprising:
a processor for executing instructions; and
a memory for storing instructions, which when executed by the processor configures the computing device to provide a method comprising:
determining, by the computing device, a plurality of possible paths, each for repositioning a tool from a first configuration to a second configuration;
determining, by the computing device, for each of the plurality of possible paths if the respective possible path is valid by simulating repositioning of the tool along the respective possible path using a simulation of the CNC machine;
selecting, by the computing device, as a positioning path one of the plurality of possible paths determined to be valid;
generating, at the computing device, positioning path data for moving the tool of the CNC machine along the selected positioning path; and
generating, at the computing device, the NC program comprising the positioning path data for controlling a position of the tool of the CNC machine;
wherein each of the plurality of possible paths is determined by:
receiving, at the computing device, the first and the second configurations;
adjusting, by the computing device, the first and second configurations;
determining, by the computing device, a new first configuration using a disengage path from the adjusted first configuration and a new second configuration using an engage path from the adjusted second configuration; and
determining, by the computing device, a path between the new first configuration and the new second configuration;
wherein the first and second configurations are adjusted based on at least workpiece proximity and wall detection to a minimum distance in a direction that does not cause the tool to be in contact with a workpiece.

19. A method for generating positioning path data for an NC program for a computer numerically controlled (CNC) machine, the method comprising:
determining, by a computing device, a plurality of possible paths, each for repositioning a tool from a first configuration to a second configuration;
determining, by the computing device, for each of the plurality of possible paths if the respective possible path is valid by simulating repositioning of the tool along the respective possible path using a simulation of the CNC machine;
selecting, by the computing device, as a positioning path one of the plurality of possible paths determined to be valid;
generating, at the computing device, positioning path data for moving the tool of the CNC machine along the selected positioning path; and
generating, at the computing device, the NC program comprising the positioning path data for controlling a position of the tool of the CNC machine;
wherein selecting the positioning path comprises:
determining a travel distance for each of the plurality of possible paths determined to be valid;
determining a travel time using the determined travel distance for each of the plurality of possible paths determined to be valid; and
selecting as the positioning path the possible path having a shortest determined travel time.

* * * * *